US012784978B2

(12) United States Patent
Han et al.

(10) Patent No.: US 12,784,978 B2
(45) Date of Patent: Nov. 3, 2026

(54) SEMICONDUCTOR DEVICE AND SEMICONDUCTOR APPARATUS AND ELECTRONIC APPARATUS INCLUDING THE SAME

(71) Applicant: Samsung Electronics Co., Ltd., Suwon-si (KR)

(72) Inventors: Narae Han, Suwon-si (KR); Jeonggyu Song, Suwon-si (KR); Beomseok Kim, Suwon-si (KR); Cheheung Kim, Suwon-si (KR); Haeryong Kim, Suwon-si (KR); Jooho Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 629 days.

(21) Appl. No.: 18/351,171

(22) Filed: Jul. 12, 2023

(65) Prior Publication Data

US 2024/0234031 A1 Jul. 11, 2024

(30) Foreign Application Priority Data

Jan. 6, 2023 (KR) ........................ 10-2023-0002500

(51) Int. Cl.
*H10D 1/66* (2025.01)
*H01G 4/10* (2006.01)
(Continued)

(52) U.S. Cl.
CPC ............... *H01G 4/10* (2013.01); *H10B 12/31* (2023.02); *H10D 1/66* (2025.01); *H10D 1/692* (2025.01);
(Continued)

(58) Field of Classification Search
None
See application file for complete search history.

(56) References Cited

U.S. PATENT DOCUMENTS 7,964,512 B2 6/2011 Wang et al.
2002/0153579 A1 10/2002 Yamamoto
(Continued)

FOREIGN PATENT DOCUMENTS

CN 108155152 A 6/2018
JP 2002-314072 A 10/2002
(Continued)

OTHER PUBLICATIONS

Merisalu et al. "Structure and Electrical Properties of Zirconium-Aluminum-Oxide Films Engineered by Atomic Layer Deposition" Coatings 2022, 12(4), 431 (Year: 2022).*

*Primary Examiner* — Xiaoming Liu
(74) *Attorney, Agent, or Firm* — Harness, Dickey & Pierce, P.L.C.

(57) ABSTRACT

A semiconductor device includes a first electrode, a second electrode spaced apart from the first electrode, a dielectric layer between the first electrode and the second electrode and including a metal oxide represented by $M_aO_b$, and a leakage current reducing layer on the dielectric layer between the first electrode and the second electrode and including an inorganic compound represented by $Al_{x1}L_{x2}O_{y1}X_{y2}$, where a, b, M, L, X, x1, x2, y1, and y2 are as described in the description.

20 Claims, 9 Drawing Sheets

(51) Int. Cl.

| | |
|---|---|
| ***H10B 12/00*** | (2023.01) |
| ***H10D 1/68*** | (2025.01) |
| ***H10D 64/68*** | (2025.01) |
| *H01G 4/008* | (2006.01) |

(52) U.S. Cl.

CPC ........... *H10D 1/694* (2025.01); *H10D 64/681* (2025.01); *H10D 64/691* (2025.01); *H01G 4/008* (2013.01)

(56) References Cited

U.S. PATENT DOCUMENTS

| | | | | |
|---|---|---|---|---|
| 2003/0059720 | A1 | 3/2003 | Hwang et al. | |
| 2006/0040457 | A1 | 2/2006 | Lee et al. | |
| 2009/0127611 | A1 * | 5/2009 | Park | H10D 30/6891 257/326 |
| 2020/0020780 | A1 * | 1/2020 | Kim | H10D 64/691 |
| 2021/0265458 | A1 * | 8/2021 | Song | H10B 12/31 |

FOREIGN PATENT DOCUMENTS

| | | | |
|---|---|---|---|
| KR | 2006-0017452 | A | 2/2006 |
| KR | 2011-0001589 | A | 1/2011 |

* cited by examiner

SEMICONDUCTOR DEVICE AND SEMICONDUCTOR APPARATUS AND ELECTRONIC APPARATUS INCLUDING THE SAME

CROSS-REFERENCE TO RELATED APPLICATION

This application is based on and claims priority under 35 U.S.C. § 119 to Korean Patent Application No. 10-2023-0002500, filed on Jan. 6, 2023, in the Korean Intellectual Property Office, the disclosure of which is incorporated by reference herein in its entirety.

BACKGROUND

1. Field

The inventive concepts relate to semiconductor devices and semiconductor apparatuses and electronic apparatuses that include the semiconductor devices.

2. Description of the Related Art

As electronic apparatuses are downscaled, the space occupied by semiconductor devices within an electronic apparatus is also being reduced. Accordingly, along with a reduction in the size of a semiconductor device such as a capacitor, a decrease in a thickness of a dielectric layer of a capacitor is required at the same time. However, in this case, a large leakage current occurs through the dielectric layer of the capacitor so that the device operation becomes difficult.

SUMMARY

Some example embodiments provide a semiconductor device having low leakage current and a large capacitance. Some example embodiments provide a semiconductor apparatus including such a semiconductor device.

Additional aspects will be set forth in part in the description which follows and, in part, will be apparent from the description, or may be learned by practice of the presented embodiments of the inventive concepts.

According to some example embodiments of the inventive concepts, a semiconductor device may include a first electrode; a second electrode spaced apart from the first electrode; a dielectric layer between the first electrode and the second electrode; and a leakage current reducing layer on the dielectric layer between the first electrode and the second electrode. The dielectric layer may include a metal oxide represented by MaOb, wherein M is an element selected from calcium (Ca), strontium (Sr), barium (Ba), scandium (Sc), yttrium (Y), lanthanum (La), titanium (Ti), Zirconium (Zr), boron (B), gallium (Ga), indium (In), hafnium (Hf), niobium (Nb), tantalum (Ta), cerium (Ce), praseodymium (Pr), neodymium (Nd), gadolinium (Gd), dysprosium (Dy), ytterbium (Yb), and lutetium (Lu), and a and b are each independently a rational number. The leakage current reducing layer may include an inorganic compound represented by Alx1Lx2Oy1Xy2, wherein L is an element selected from Ca, Sr, Ba, Sc, Y, La, Ti, Zr, B, Ga, In, Hf, Nb, Ta, Ce, Pr, Nd, Gd, Dy, Yb, and Lu, X is an element selected from sulfur(S), selenium (Se), tellurium (Te), fluorine (F), chlorine (Cl), bromine (Br), and iodine (I), and x1, x2, y1, and y2 are each independently a rational number.

M may be an element selected from Ca, Sr, Ba, Zr, B, manganese (Mn), iron (Fe), cobalt (Co), nickel (Ni), copper (Cu), and zinc (Zn).

In $M_aO_b$, a may be an integer from 1 to 3, and b may be an integer from 1 to 5.

In $Al_{x1}L_{x2}O_{y1}X_{y2}$, L may be an element selected from Ca, Sr, Ba, B, Zr, manganese (Mn), iron (Fe), cobalt (Co), nickel (Ni), copper (Cu), and zinc (Zn).

In $Al_{x1}L_{x2}O_{y1}X_{y2}$, X may be an element selected from F, Cl, Br, and I.

In $Al_{x1}L_{x2}O_{y1}X_{y2}$, x1, x2, y1, and y2 may satisfy Conditions i) to iii): i) $x1+x2=2$; ii) $y1+y2=3$; and iii) $0.55 \leq y2 \leq 2$.

the dielectric layer may include a first dielectric layer and a second dielectric layer. The leakage current reducing layer may be between the first dielectric layer and the second dielectric layer.

The leakage current reducing layer may be between the first electrode and the dielectric layer.

The leakage current reducing layer may be between the second electrode and the dielectric layer.

A thickness of the leakage current reducing layer may be greater than or equal to 0.1 Å and less than or equal to 4.5 Å.

A total thickness of the dielectric layer and the leakage current reducing layer may be less than or equal to 50 Å.

The dielectric layer may have a single-film structure or a multi-layer structure in which different materials are stacked.

The first electrode and the second electrode may each include at least one selected from tungsten (W), TaN, TiN, $RuO_x$, TiN, NbN, Sc, aluminum (Al), molybdenum (Mo), MON, palladium (Pd), platinum (Pt), tin (Sn), La, and ruthenium (Ru).

One of the first electrode or the second electrode may include a semiconductor material.

According to some example embodiments, a semiconductor apparatus may include a field effect transistor and a capacitor electrically connected to the field effect transistor. The capacitor may include a first electrode, a second electrode spaced apart from the first electrode, a dielectric layer between the first electrode and the second electrode, and a leakage current reducing layer on the dielectric layer between the first electrode and the second electrode. The dielectric layer may include a metal oxide represented by MaOb, wherein M is an element selected from calcium (Ca), strontium (Sr), barium (Ba), scandium (Sc), yttrium (Y), lanthanum (La), titanium (Ti), Zirconium (Zr), boron (B), gallium (Ga), indium (In), hafnium (Hf), niobium (Nb), tantalum (Ta), cerium (Ce), praseodymium (Pr), neodymium (Nd), gadolinium (Gd), dysprosium (Dy), ytterbium (Yb), and lutetium (Lu), and a and b are each independently a rational number. The leakage current reducing layer may include an inorganic compound represented by Alx1Lx2Oy1Xy2, wherein L is an element selected from Ca, Sr, Ba, Sc, Y, La, Ti, Zr, B, Ga, In, Hf, Nb, Ta, Ce, Pr, Nd, Gd, Dy, Yb, and Lu, and X is an element selected from sulfur(S), selenium (Se), tellurium (Te), fluorine (F), chlorine (Cl), bromine (Br), and iodine (I), and x1, x2, y1, and y2 are each independently a rational number.

The field effect transistor may include: a semiconductor layer comprising a source and a drain; a separate dielectric layer on the semiconductor layer; and a gate electrode on the separate dielectric layer.

The dielectric layer may include a first dielectric layer and a second dielectric layer, and the leakage current reducing layer may be between the first dielectric layer and the second dielectric layer.

The leakage current reducing layer may be between the first electrode and the dielectric layer or may be between the second electrode and the dielectric layer.

The first electrode and the second electrode may each comprise at least one selected from tungsten (W), TaN, TiN, $RuO_x$, TiN, NbN, Sc, aluminum (Al), molybdenum (Mo), MON, palladium (Pd), platinum (Pt), tin (Sn), La, and ruthenium (Ru).

According to some example embodiments, an electronic apparatus may include the semiconductor apparatus.

BRIEF DESCRIPTION OF THE DRAWINGS

The above and other aspects, features, and advantages of certain embodiments of the inventive concepts will be more apparent from the following description taken in conjunction with the accompanying drawings, in which.

DETAILED DESCRIPTION

Figure 1:
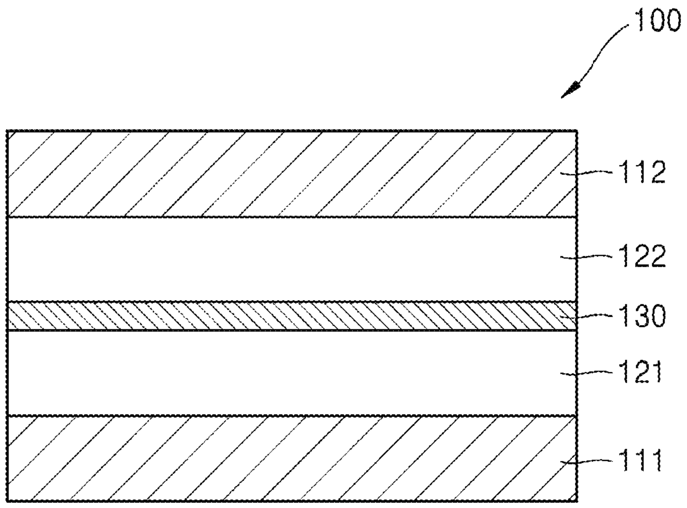
FIG. 1 is a cross-sectional view of a semiconductor device according to some example embodiments.

Reference will now be made in detail to example embodiments, some of which are illustrated in the accompanying drawings, wherein like reference numerals refer to like elements throughout. In this regard, some example embodiments may have different forms and should not be construed as being limited to the descriptions set forth herein. Accordingly, some example embodiments are merely described below, by referring to the figure, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, some example embodiments will be described in detail with reference to the accompanying drawings. In the following drawings, the same reference numerals denote the same components, and the size of each component in the drawings may be exaggerated for clarity and convenience of description. Meanwhile, some example embodiments described below are illustrative examples of some example embodiments, and various changes in forms and details may be made. The use of all illustrations or illustrative terms in some example embodiments is simply to describe the technical ideas in detail, and the scope of the present inventive concepts is not limited by the illustrations or illustrative terms unless they are limited by claims.

Hereinafter, when a component or the like is referred to as being "above" or "on" another component, the component can be directly above, below, left, and right of the other component by contact or above, below, left, and right of the other component in a non-contact manner. An expression used in the singular encompasses the expression of the plural, unless it has a clearly different meaning in the context. In addition, when a portion "includes" an element, another element may be further included, rather than excluding the existence of the other element, unless otherwise described.

The use of the term "the' and similar referents is construed to cover both the singular and the plural. Unless the order of steps constituting the method is explicitly stated or stated to the contrary, these steps may be performed in any suitable order, and are not necessarily limited to the order described.

Terms such as "first", "second", "third", or the like may be used to describe various components, but are used only for the purpose of distinguishing one component from other components, and the order, type, or the like of the components are not limited. Also, such terms as " . . . unit" or "module" described throughout the specification refers to a unit that processes at least one function or operation, which can be implemented by a hardware or a software or a combination of a hardware and a software.

Connections of lines or connecting members between components shown in the drawings are examples of functional connections and/or physical or circuit connections, which can be replaced in actual devices or shown as additional various functional connections, physical connections, or as circuit connections.

Use of all examples or example terms is simply for explaining technical ideas in detail, and the scope of the inventive concepts is not limited due to these examples or example terms unless limited by the claims.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular", "substantially parallel", or "substantially coplanar" with regard to other elements and/or properties thereof will be understood to be "perpendicular", "parallel", or "coplanar", respectively, with regard to the other elements and/or properties thereof within manufacturing tolerances and/or material tolerances and/or have a deviation in magnitude and/or angle from "perpendicular", "parallel", or "coplanar", respectively, with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same. While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

Some example embodiments of the inventive concepts provide a semiconductor device having low leakage current and a large capacitance.

FIG. 1 is a cross-sectional view of a semiconductor device 100 according to some example embodiments. The semiconductor device 100 of FIG. 1 may be a capacitor.

Referring to FIG. 1, the semiconductor device 100 may include a first electrode 111, a second electrode 112, a first dielectric layer 121, a second dielectric layer 122, and a leakage current reducing layer 130. The first electrode 111 and the second electrode 112 are spaced apart from each other, and the first dielectric layer 121 and the second dielectric layer 122 are respectively provided besides (e.g., adjacent to) the first electrode 111 and the second electrode 112. Also, the leakage current reducing layer 130 is provided between the first dielectric layer 121 and the second dielectric layer 122.

The first electrode 111, which is a lower electrode, may be disposed on a substrate (not shown). The substrate may be a part of a structure supporting the semiconductor device 100 (i.e., a capacitor), or a part of a device connected to the semiconductor device 100 (i.e., a capacitor). The substrate may include semiconductor material patterns, insulating material patterns, and/or conductive material patterns. The substrate may include, for example, a substrate 11', a gate stack 12, an interlayer insulation layer 15, a contact structure 20', and/or a bitline structure 13, which will be described in connection with FIGS. 6 and 7.

The substrate may include, for example, a semiconductor material, such as silicon (Si), germanium (Ge), silicon germanium (SiGe), silicon carbide (SiC), gallium arsenic (GaAs), indium arsenic (InAs), indium phosphide (InP), or the like, and/or an insulating material, such as silicon oxide, silicon nitride, silicon oxynitride, or the like.

The second electrode 112, which is an upper electrode, may be spaced apart from the first electrode 111 to face the first electrode 111. The first electrode 111 and the second electrode 112 may each independently include a metal, a metal nitride, a metal oxide, or a combination thereof. For example, the first electrode 111 and second electrode 112 may each independently include: a metal, such as ruthenium (Ru), titanium (Ti), tantalum (Ta), niobium (Nb), iridium (Ir), molybdenum (Mo), tungsten (W), platinum (Pt), etc.; a conductive metal nitride, such as titanium nitride (TiN), tantalum nitride (TaN), niobium nitride (NbN), molybdenum nitride (MoN), cobalt nitride (CoN), tungsten nitride (WN), etc.; and/or a conductive metal oxide, such as platinum oxide (PtO), iridium oxide ($IrO_2$), ruthenium oxide ($RuO_2$), strontium ruthenium oxide ($SrRuO_3$), barium strontium ruthenium oxide ($(Ba,Sr)RuO_3$), calcium ruthenium oxide ($CaRuO_3$), lanthanum strontium cobalt oxide ($(La,Sr)CoO_3$), etc.

For example, the first electrode 111 and the second electrode 112 may each independently include metal nitride represented by MM'N. Here, M is a metal element, M' is an element different from M, and N is nitrogen. Such metal nitride may include MN metal nitride doped with element M'.

M may be, for example, one or two or more elements selected from Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, TI, Pb, Bi, Po, Fr, Ra, Ac, Th, Pa, and U.

M' may be, for example, one or two or more elements selected from H, Li, Be, B, N, O, Na, Mg, Al, Si, P, S, K, Ca, Sc, Ti, V, Cr, Mn, Fe, Co, Ni, Cu, Zn, Ga, Ge, As, Se, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, TI, Pb, Bi, Po, Fr, Ra, Ac, Th, Pa, and U.

The first electrode 111 and the second electrode 112 may each independently include a single material layer structure or a structure in which multiple material layers are stacked. In some example embodiments, the first electrode 111 and/or the second electrode 112 may be a single layer of TiN or a single layer of NbN. In some example embodiments, the first electrode 111 and/or the second electrode 112 may have a structure in which a first electrode layer including TiN and a second electrode layer including NbN are stacked.

The first dielectric layer 121 is on an upper surface of the first electrode 111, and the second dielectric layer 122 is on a lower surface of the second electrode 112. The first dielectric layer 121 and the second dielectric layer 122 may each include a dielectric material having paraelectric characteristics. For example, the first dielectric layer 121 and the second dielectric layer 122 may each include a dielectric material having a dielectric constant of about 20 or more and about 70 or less.

The first dielectric layer 121 and the second dielectric layer 122 may each include a metal oxide represented by $M_xO_y$ (wherein x and y may be natural numbers, rational numbers, or the like). Natural numbers may be referred to interchangeably herein as integers, positive integers, or the like. Here, M may be a metal element selected from Ca, Sr, Ba, Sc, Y, La, Ti, Zr, Hf, Nb, Ta, Ce, Pr, Nd, Gd, Dy, Yb, and Lu. For example, x in $M_xO_y$ may be a natural number from 1 to 3. For example, y in $M_xO_y$ may be a natural number from 1 to 5. For example, x in $M_xO_y$ may be a rational number from 1 to 3. For example, y in $M_xO_y$ may be a rational number from 1 to 5. $M_xO_y$ may be referred to interchangeably herein as $M_aO_b$, wherein M is an element selected from calcium (Ca), strontium (Sr), barium (Ba), scandium (Sc), yttrium (Y), lanthanum (La), titanium (Ti), Zirconium (Zr), boron (B), gallium (Ga), indium (In), hafnium (Hf), niobium (Nb), tantalum (Ta), cerium (Ce), praseodymium (Pr), neodymium (Nd), gadolinium (Gd), dysprosium (Dy), ytterbium (Yb), and lutetium (Lu), and "a" and "b" are natural numbers, rational numbers, or the like (e.g., "a" and "b" are each independently a rational number, which may each be the same or different rational numbers and which may each be any rational number). In some example embodiments, "a" in $M_aO_b$ may be a natural number from 1 to 3, and "b" in $M_aO_b$ may be a natural number from 1 to 5. In some example embodiments, "a" in $M_aO_b$ may be a rational number from 1 to 3, and "b" in $M_aO_b$ may be a rational number from 1 to 5. It will be understood that, where a number is described herein to be from a first number value to a second number value, the number may be inclusively between the first and second number values.

The first dielectric layer 121 and the second dielectric layer 122 may include the same metal oxide, but example embodiments are not limited thereto. That is, the first dielectric layer 121 and the second dielectric layer 122 may include metal oxides that are different from each other. The first dielectric layer 121 and the second dielectric layer 122 may each independently include a single film structure or a multi-film structure in which multiple material layers are stacked.

The leakage current reducing layer 130 may be provided between the first dielectric layer 121 and the second dielectric layer 122. The leakage current reducing layer 130 may serve (e.g., may be configured) to reduce leakage current flowing inside the semiconductor device 100 (i.e., a capacitor). In this regard, the leakage current reducing layer 130 may include an inorganic compound represented by $Al_{x1}L_{x2}O_{y1}X_{y2}$. Here, L may be an element selected from Ca, Sr, Ba, Sc, Y, La, Ti, Zr, B, Ga, In, Hf, Nb, Ta, Ce, Pr, Nd, Gd, Dy, Yb, and Lu, X may be an element selected from S, Se, Te, F, Cl, Br, and I, and x1, x2, y1, and y2 may each independently be a natural number, which may each be the same or different natural numbers and which may each be any natural number. In some example embodiments, x1, x2, y1, and y2 may each independently be a rational number, which may each be the same or different rational numbers and which may each be any rational number. Such an inorganic compound may have paraelectric characteristics.

In some example embodiments, an inorganic compound represented by $Al_{x1}L_{x2}O_{y1}X_{y2}$ may be obtained by etching a metal oxide represented by $Al_{x1}L_{x2}O_y$ with etching gas containing X. For example, X may be F, and the etching gas may contain a fluorine-containing compound. Also, X may be chlorine (Cl), and the etching gas may contain a Cl-containing compound.

In detail, L may be an element selected from Ca, Sr, Ba, B, Mn, Fe, Co, Ni, Cu, and Zn. Also, X may be an element selected from F, Cl, Br, and I. As a result, such a metal oxide may have further improved paraelectric characteristics.

In some example embodiments, in $Al_{x1}L_{x2}O_{y1}X_{y2}$, the sum of x1 and x2 may be a natural number from 1 to 3 (e.g., any natural number inclusively between 1 and 3), and x2 may be a rational number greater than or equal to 0. Also, in $Al_{x1}L_{x2}O_{y1}X_{y2}$, the sum of y1 and y2 may be a natural number from 1 to 5 (e.g., any natural number inclusively between 1 and 5), and y2 may be a rational number greater than or equal to 0. In some example embodiments, in $Al_{x1}L_{x2}O_{y1}X_{y2}$, the sum of x1 and x2 may be a rational number from 1 to 3 (e.g., any rational number inclusively between 1 and 3), and x2 may be a rational number greater than or equal to 0. Also, in $Al_{x1}L_{x2}O_{y1}X_{y2}$, the sum of y1 and y2 may be a rational number from 1 to 5 (e.g., any rational number inclusively between 1 and 5), and y2 may be a rational number greater than or equal to 0.

Also, regarding an inorganic compound represented by $Al_{x1}L_{x2}O_{y1}X_{y2}$, x1, x2, y1, and y2 may satisfy Conditions i) to iii). When Conditions i) to iii) are satisfied, the paraelectric characteristics of the inorganic compound may be further improved and the leakage current may be further reduced, such that performance of a semiconductor device 100 (e.g., a capacitor) may be improved due to reduced leakage current and/or increased capacitance based on the semiconductor device 100 including the leakage current reducing layer 130 according to some example embodiments:

$$x1 + x2 = 2; \quad \text{i)}$$

$$y1 + y2 = 3; \text{ and} \quad \text{ii)}$$

$$0.5 \leq y2 \leq 2. \quad \text{iii)}$$

In some example embodiments, the leakage current reducing layer 130 may include an inorganic compound represented by $Al_{x1}L_{x2}O_{y1}X_{y2}$, where, L is an element selected from Ca, Sr, Ba, Sc, Y, La, Ti, Zr, B, Ga, In, Hf, Nb, Ta, Ce, Pr, Nd, Gd, Dy, Yb, and Lu, X is an element selected from sulfur (S), selenium (Se), tellurium (Te), fluorine (F), chlorine (Cl), bromine (Br), and iodine (I), and x1, x2, y1, and y2 are each independently a natural number, a rational number, or the like (e.g., are each independently any natural number, any rational number, or the like) which may not satisfy Conditions i) to iii) above. In such example embodiments, the paraelectric characteristics of the inorganic compound may still be further improved and the leakage current may be further reduced, such that performance of a semiconductor device 100 (e.g., a capacitor) may be improved due to reduced leakage current and/or increased capacitance based on the semiconductor device 100 including the leakage current reducing layer 130 according to some example embodiments. As described herein, an apparatus and/or device may have improved power consumption characteristics (e.g., reduced power consumption during operation), improved operational performance and/or efficiency, based on including a semiconductor device having reduced leakage current and/or increased capacitance based on the semiconductor device including the leakage current reducing layer according to some example embodiments.

A thickness of the leakage current reducing layer 130 may be greater than or equal to about 0.1 Å and less than or equal to about 4.5 Å. A total thickness of the first dielectric layer 121, the second dielectric layer 122, and the leakage current reducing layer 130 may be less than or equal to about 50 Å (e.g., between about 10 Å and about 50 Å, between about 20 Å and about 50 Å, between about 30 Å and about 50 Å, between about 40 Å and about 50 Å, or the like). In some example embodiments, the total thickness of the first dielectric layer 121, the second dielectric layer 122, and the leakage current reducing layer 130 may be greater than or equal to about 40 Å and less than or equal to about 50 Å. However, example embodiments are not limited thereto.

In the semiconductor device 100 (i.e., a capacitor) according to some example embodiments, the leakage current reducing layer 130 including an inorganic compound represented by $Al_{x1}L_{x2}O_{y1}X_{y2}$ where x1, x2, y1, and y2 are each independently a natural number, a rational number, or the like, which may or may not satisfy Conditions i) to iii) above, is provided between the first dielectric layer 121 and the second dielectric layer 122, thereby increasing a capacitance and reducing a leakage current value, such that performance of a semiconductor device 100 (e.g., a capacitor) may be improved due to reduced leakage current and/or increased capacitance based on the semiconductor device 100 including the leakage current reducing layer 130 between the first dielectric layer 121 and the second dielectric layer 122 according to some example embodiments.

Hereinabove, the case where the semiconductor device 100 is a capacitor having a metal-insulator-metal (MIM) structure in which both the first electrode 111 and the second electrode 112 include a conductive material has been described. However, the example embodiments are not limited thereto, and the semiconductor device 100 may be a capacitor having a metal-insulator-semiconductor (MIS) structure in which one of the first electrode and the second electrode includes a conductive material and the other includes a semiconductor material.

Meanwhile, to manufacture the semiconductor device of FIG. 1, the first dielectric layer 121 may be formed on the first electrode 111, the leakage current reducing layer 130 may be formed on the first dielectric layer 121, the second dielectric layer 122 may be formed on the leakage current reducing layer 130, and the second electrode 112 may be formed on the second dielectric layer 122.

For example, the first electrode 111 may be formed on a substrate SU by a deposition process, the first dielectric layer 121 may be formed on the first electrode 111 by a deposition process, the leakage current reducing layer 130 may be formed on the first dielectric layer 121 by a deposition process, the second dielectric layer 122 may be formed on the leakage current reducing layer 130 by a deposition process, and the second electrode 112 may be formed on the second dielectric layer 122 by a deposition process.

The deposition process used for the deposition of each layer may include a chemical vapor deposition (CVD) process, a physical vapor deposition (PVD) process, or an atomic layer deposition (ALD) process.

In addition, regarding the manufacture of the semiconductor device 100, in some example embodiments, after the leakage current reducing layer 130 is formed on the first dielectric layer 121, the leakage current reducing layer 130 may be etched by using an etching gas composition.

Regarding the manufacture of the semiconductor device 100, in some example embodiments, the etching gas composition used as part of the etching may include at least one compound selected from a boron-containing compound, a sulfur-containing compound, a fluorine-containing compound, and a chlorine-containing compound.

Regarding the manufacture of some example embodiments, the boron-containing compound may have a B—Z linkage and the number of B may be a rational number from 1 to 4. Here, Z may be one of H, F, Cl, Br, or I.

In some example embodiments, the boron-containing compound may include at least one selected from $BF_3$, $HBF_2$, $H_2BF$, $BCl_3$, $HBCl_2$, $H_2BCl$, $BFCl_2$, $BF_2Cl$, HBFCl, $BBr_3$, $HBBr_2$, $H_2BBr$, $BFBr_2$, $BF_2Br$, HBFBr, $BClBr_2$, $BCl_2Br$, HBClBr, and BFClBr.

Regarding the manufacture of some example embodiments, the sulfur-containing compound may have a C—F linkage and a C—S linkage, and the number of sulfur may be from 1 to 4. In addition, the sulfur-containing compound may have a S—H linkage.

In some example embodiments, the sulfur-containing compound may be a 5- or 6-membered heterocyclic compound including sulfur as a heteroelement. In some example embodiments, the sulfur-containing compound may have a formula of $C_xF_yS_z$. Here, x may be an integer from 1 to 6, y may be an integer from 1 to 16, and z may be an integer from 1 to 4.

In some example embodiments, the sulfur-containing compound may include at least one C—S—C linkage and/or at least one double linkage (i.e., —C═C—). In some example embodiments, the sulfur-containing compound may be a 5- or 6-membered heterocyclic compound containing only one sulfur atom.

In some example embodiments, the sulfur-containing compound may include at least one selected from methanethioyl fluoride, difluoromethanethione, trifluormethanthiyl-radical, trifluoro(trifluoromethyl)sulfur(IV), pentafluoro(trifluoromethyl)-$\lambda^6$-sulfane, trifluoromethylmercaptothiocarbonyl fluoride, 2,2,4,4-tetrafluoro-1,3-dithietane, trifluoro(trifluoromethylsulfanyl)methane, trifluoro-(trifluoromethyldisulfanyl)methane, trifluoro-(trifluoromethyltrisulfanyl)methane, trifluoro-(trifluoromethyltetrasulfanyl) methane, difluorobis(trifluoromethyl)sulfur(IV), 1,1,2-trifluoro-2-pentafluorosulfanylethene, bis(trifluoromethyl)

tetrafluorosulfur(VI), pentafluoro(1,1,2,2,2-pentafluoroethyl)-λ$^6$-sulfane, hexafluorothioacetone, bis(trifluoromethylsulfanyl)methanethione, 3,3,3-trifluoro-1-pentafluorosulfanyl-1-propyne, hexadecafluoro-octahydro-1,4-dithiane, 3,3,3-trifluoro-2-(trifluoromethyl)prop-1-ene-1-thione, 2,2,3,4,5,5-hexafluorothiophene, 3,4-bis(trifluoromethyl)dithiete, bis(trifluoromethylmercapto)acetylene, perfluorotetrahydrothiophene, 2,2-difluoro-3,3-bis(trifluoromethyl)thiirane, perfluorocyclohexanesulfurpentafluoride, and $H_2S$.

Regarding the manufacture of some example embodiments, the fluorine-containing compound may be a $C_1$-$C_6$ organic fluorine compound or a $C_1$-$C_6$ inorganic fluorine compound not containing carbon. In some example embodiments, the fluorine-containing compound may have a formula of $C_aF_bH_c$. Here, a may be an integer from 1 to 6, b may be an integer from 1 to 10, and c may be an integer from 1 to 6.

In some example embodiments, the fluorine-containing compound may include at least one of hydrogen fluoride (HF), fluoromethane, difluoromethane, trifluoromethane, tetrafluoromethane, trifluoroethane, tetrafluoroethane, pentafluoroethane, hexafluoroethane, trifluoropropane, tetrafluoropropane, pentafluoropropane, hexafluoropropane, tetrafluoropropene, difluoropropane, pentafluorobutane, heptafluorobutane, octafluorobutane, hexafluorobutene, decafluoropentane, hexafluorocyclopentane, heptafluorocyclopentane, octafluorocyclopentane, heptafluorocyclopentene, or nonafluorohexene.

In some example embodiments, the fluorine-containing compound may include at least one selected from 1h-heptafluoropropane, 1,1,1,2,3,3,3-heptafluoropropane, 1,1,1,2,2,3-hexafluoropropane, 1,1,1,2,3,3-hexafluoropropane, 1,1,1,3,3,3-hexafluoropropane, 1,1,2,2,3,3-hexafluoropropane, 1,1,2,2,3-pentafluoropropane, 1,1,1,2,2-pentafluoropropane, 1,1,2,3,3-pentafluoropropane, 1,1,1,2,3-pentafluoropropane, 1,1,1,3,3-pentafluoropropane, 1,1,2,2-tetrafluoropropane, 1,1,1,2-tetrafluoropropane, 1,2,2,3-tetrafluoropropane, 1,1,1,3-tetrafluoropropane, 1,1,3,3-tetrafluoropropane, 1,1,2,3-tetrafluoropropane, 1,1,3-trifluoropropane, 1,1,2-trifluoropropane, 1,2,3-trifluoropropane, 1,1,2-trifluoropropane, 1,1,1-trifluoropropane, 1,1-difluoropropane, 1,2-difluoropropane, 2,2-difluoropropane, 1-fluoropropane, 2-fluoropropane, 1,1,3,3,3-pentafluoroprop-1-ene, 1,1,2,3,3-pentafluoroprop-1-ene, 1,2,3,3,3-pentafluoroprop-1-ene, 1,3,3,3-tetrafluoroprop-1-ene, 1,1,3,3-tetrafluoroprop-1-ene, 2,3,3,3-tetrafluoroprop-1-ene, 1,2,3,3-tetrafluoroprop-1-ene, 1,1,2,3-tetrafluoroprop-1-ene, 3,3,3-trifluoroprop-1-ene, 1,1,3-trifluoroprop-1-ene, 1,3,3-trifluoroprop-1-ene, 1,1,2-trifluoroprop-1-ene, 1,2,3-trifluoroprop-1-ene, 2,3,3-trifluoroprop-1-ene, 1,1-difluoroprop-1-ene, 1,3-difluoroprop-1-ene, 3,3-difluoroprop-1-ene, 1,2-difluoroprop-1-ene, 2,3-difluoroprop-1-ene, 1-fluoroprop-1-ene, 2-fluoroprop-1-ene, 3-fluoroprop-1-ene, 1,1,1,2,2,3,3,4,4-nonafluorobutane, 1,1,1,2,2,3,4,4,4-nonafluorobutane, 1,1,1,2,2,3,3,4-octafluorobutane, 1,1,1,2,2,4,4,4-octafluorobutane, 1,1,2,2,3,3,4,4-octafluorobutane, 1,1,1,2,2,3,4,4-octafluorobutane, 1,1,1,2,3,4,4,4-octafluorobutane, 1,1,1,2,3,3,4,4-octafluorobutane, 1,1,1,2,2,3,3-heptafluorobutane, 1,1,1,2,2,4,4-heptafluorobutane, 1,1,1,3,3,4,4-heptafluorobutane, 1,1,2,2,3,3,4-heptafluorobutane, 1,1,1,2,4,4,4-heptafluorobutane, 1,1,1,2,2,3,4-heptafluorobutane, 1,1,1,2,3,4,4-heptafluorobutane, 1,1,2,2,3,4,4-heptafluorobutane, 1,1,1,2,2,3-hexafluorobutane, 1,1,1,2,3,3-hexafluorobutane, 1,1,2,2,3,3-hexafluorobutane, 1,1,1,2,2,4-hexafluorobutane, 1,1,1,3,3,4-hexafluorobutane, 1,2,2,3,3,4-hexafluorobutane, 1,1,1,4,4,4-hexafluorobutane, 1,1,1,2,3,4-hexafluorobutane, 1,1,2,2,3,4-hexafluorobutane, 1,1,2,3,3,4-hexafluorobutane, 1,1,1,3,4,4-hexafluorobutane, 1,1,1,2,4,4-hexafluorobutane, 1,1,2,2,4,4-hexafluorobutane, 1,1,2,3,4,4-hexafluorobutane, 1,1,1,2,2-pentafluorobutane, 1,1,1,3,3-pentafluorobutane, 1,1,1,4,4-pentafluorobutane, 1,1,1,2,3-pentafluorobutane, 1,1,1,2,4-pentafluorobutane, 1,1,1,3,4-pentafluorobutane, 1,1,2,2,3-pentafluorobutane, 1,1,2,2,4-pentafluorobutane, 1,1,3,3,4-pentafluorobutane, 1,1,2,3,3-pentafluorobutane, 1,1,2,4,4-pentafluorobutane, 1,2,2,3,3-pentafluorobutane, 1,1,2,3,4-pentafluorobutane, 1,2,2,3,4-pentafluorobutane, 1,1,2,2,3,3,4-heptafluorocyclopentane, 1,1,2,2,3,3-hexafluorocyclopentane, 1h,2h-octafluorocyclopentane, 3,3,4,4,5,5-hexafluorocyclopentene, 1,3,3,4,4,5,5-heptafluorocyclopentene, 2h,3h-decafluoropentane, and 3,3,4,4,5,5,6,6,6-nonafluorohex-1-ene.

Regarding the manufacture of some example embodiments, the chlorine-containing compound may be a $C_1$-$C_6$ organic chlorine compound or a $C_1$-$C_6$ inorganic chlorine compound not containing carbon.

In some example embodiments, the organic chlorine-containing compound may have a formula of $C_aCl_bH_c$. Here, a may be an integer from 1 to 6, b may be an integer from 1 to 10, and c may be an integer from 1 to 6.

In some example embodiments, the inorganic chlorine-containing compound may have a formula of $M^1{}_aCl_b$. Here, $M^1$ may be at least one element selected from H, B, and Si. Also, a may be a rational number from 0 to 4, and b may be a rational number from 1 to 4. For the inorganic chlorine compound, at least one compound selected from $C_{12}$, HCl, $BCl_3$, $HBCl_2$, $H_2BCl$, $SiCl_4$, $HSiCl_3$, $H_2SiCl_2$, and $H_3SiCl$ may be considered.

In some example embodiments, the organic chlorine compound may include at least one of chloromethane, dichloromethane, trichloromethane, tetrachloromethane, trichloroethane, tetrachloroethane, pentachloroethane, hexachloroethane, trichloropropane, tetrachloropropane, pentachloropropane, hexachloropropane, tetrachloropropene, dichloropropane, pentachlorobutane, heptachlorobutane, octachlorobutane, hexachlorobutene, decachloropentane, hexachlorocyclopentane, heptachlorocyclopentane, octachlorocyclopentane, heptachlorocyclopentene, or nonachlorohexene.

In some example embodiments, the organic chlorine compound may include 1 h-heptachloropropane, 1,1,1,2,3,3,3-heptachloropropane, 1,1,1,2,2,3-hexachloropropane, 1,1,1,2,3,3-hexachloropropane, 1,1,1,3,3,3-hexachloropropane, 1,1,2,2,3,3-hexachloropropane, 1,1,2,2,3-pentachloropropane, 1,1,1,2,2-pentachloropropane, 1,1,2,3,3-pentachloropropane, 1,1,1,2,3-pentachloropropane, 1,1,1,3,3-pentachloropropane, 1,1,2,2-tetrachloropropane, 1,1,1,2-tetrachloropropane, 1,2,2,3-tetrachloropropane, 1,1,1,3-tetrachloropropane, 1,1,3,3-tetrachloropropane, 1,1,2,3-tetrachloropropane, 1,1,3-trichloropropane, 1,1,2-trichloropropane, 1,2,3-trichloropropane, 1,1,2-trichloropropane, 1,1,1-trichloropropane, 1,1-dichloropropane, 1,2-dichloropropane, 2,2-dichloropropane, 1-chloropropane, 2-chloropropane, 1,1,3,3,3-pentachloroprop-1-ene, 1,1,2,3,3-pentachloroprop-1-ene, 1,2,3,3,3-pentachloroprop-1-ene, 1,3,3,3-tetrachloroprop-1-ene, 1,1,3,3-tetrachloroprop-1-ene, 2,3,3,3-tetrachloroprop-1-ene, 1,2,3,3-tetrachloroprop-1-ene, 1,1,2,3-tetrachloroprop-1-ene, 3,3,3-trichloroprop-1-ene, 1,1,3-trichloroprop-1-ene, 1,3,3-trichloroprop-1-ene, 1,1,2-trichloroprop-1-ene, 1,2,3-trichloroprop-1-ene, 2,3,3-trichloroprop-1-ene, 1,1-dichloroprop-1-ene, 1,3-dichloroprop-1-ene, 3,3-dichloroprop-1-ene, 1,2-dichloroprop-1-ene, 2,3-dichloroprop-1-ene, 1-chloroprop-1-ene, 2-chloroprop-1-ene, 3-chloroprop-1-ene, 1,1,1,2,2,3,3,4,4-nonachlorobutane, 1,1,1,2,2,3,4,4,4-nonachlorobutane, 1,1,1,2,2,3,3,4-octachlorobutane, 1,1,1,2,2,4,4,4-octachlorobutane, 1,1,2,2,3,3,4,4-octachlorobutane, 1,1,1,2,2,3,4,4-octachlorobutane, 1,1,1,2,3,4,4,4-octachlorobutane, 1,1,1,2,3,3,4,4-octachlorobutane, 1,1,1,2,2,3,3-heptachlorobutane, 1,1,1,2,2,4,4-heptachlorobutane, 1,1,1,3,3,4,4-heptachlorobutane, 1,1,2,2,3,3,4-heptachlorobutane, 1,1,1,2,4,4,4-heptachlorobutane, 1,1,1,2,2,3,4-heptachlorobutane, 1,1,1,2,3,4,4-heptachlorobutane, 1,1,2,2,3,4,4-heptachlorobutane, 1,1,1,2,2,3-hexachlorobutane, 1,1,1,2,3,3-hexachlorobutane, 1,1,2,2,3,3-hexachlorobutane, 1,1,1,2,2,4-hexachlorobutane, 1,1,1,3,3,4-hexachlorobutane, 1,2,2,3,3,4-hexachlorobutane, 1,1,1,4,4,4-hexachlorobutane, 1,1,1,2,3,4-hexachlorobutane, 1,1,2,2,3,4-hexachlorobutane, 1,1,2,3,3,4-hexachlorobutane, 1,1,1,3,4,4-hexachlorobutane, 1,1,1,2,4,4-hexachlorobutane, 1,1,2,2,4,4-hexachlorobutane, 1,1,2,3,4,4-hexachlorobutane, 1,1,1,2,2-pentachlorobutane, 1,1,1,3,3-pentachlorobutane, 1,1,1,4,4-pentachlorobutane, 1,1,1,2,3-pentachlorobutane, 1,1,1,2,4-pentachlorobutane, 1,1,1,3,4-pentachlorobutane, 1,1,2,2,3-pentachlorobutane, 1,1,2,2,4-pentachlorobutane, 1,1,3,3,4-pentachlorobutane, 1,1,2,3,3-pentachlorobutane, 1,1,2,4,4-pentachlorobutane, 1,2,2,3,3-pentachlorobutane, 1,1,2,3,4-pentachlorobutane, 1,2,2,3,4-pentachlorobutane, 1,1,2,2,3,3,4-heptachlorocyclopentane, 1,1,2,2,3,3-hexachlorocyclopentane, 1h,2h-octachlorocyclopentane, 3,3,4,4,5,5-hexachlorocyclopentene, 1,3,3,4,4,5,5-heptachlorocyclopentene, 2h,3h-decachloropentane, and 3,3,4,4,5,5,6,6,6-nonachlorohex-1-ene.

According to example embodiments of the inventive concepts, a method of manufacturing a semiconductor device (e.g., the semiconductor device 200 shown in FIG. 2, the semiconductor device 300 shown in FIG. 3, or the like) may include: preparing a substrate; forming a first electrode on the substrate; forming a first dielectric layer on the first electrode; forming a leakage current reducing layer on the first electrode; and forming a second electrode on the first dielectric layer and the leakage current reducing layer, and may further include etching the leakage current reducing layer after the forming of the leakage current reducing layer (e.g., prior to forming the second electrode).

In the method of manufacturing the semiconductor device according to some example embodiments, the leakage current reducing layer may be formed on the first dielectric layer. In this case, the first dielectric layer may directly contact the first electrode.

In the method of manufacturing the semiconductor device according to some example embodiments, the first dielectric layer may be formed on the leakage current reducing layer. In this case, the leakage current reducing layer may directly contact the first electrode.

The method of manufacturing the semiconductor device according to some example embodiments may further include forming a second dielectric layer on (e.g., directly or indirectly on) the first dielectric layer. In this case, the first dielectric layer and the second dielectric layer may include the same or different compounds. Also, the leakage current reducing layer may be arranged between the first dielectric layer and the second dielectric layer. Also, the leakage current reducing layer may be arranged on the first dielectric layer and the second dielectric layer, or the first dielectric layer and the second dielectric layer may be arranged on the leakage current reducing layer.

In the method of manufacturing the semiconductor device according to some example embodiments, the etching of the leakage current reducing layer may be performed in an etching chamber. Meanwhile, the method of manufacturing the semiconductor device according to some example embodiments may be performed in an etching chamber.

In the method of manufacturing the semiconductor device according to some example embodiments, the etching of the leakage current reducing layer may be performed in dry.

In the method of manufacturing the semiconductor device according to some example embodiments, the etching of the leakage current reducing layer may be performed by using an etching gas composition.

In the method of manufacturing the semiconductor device according to some example embodiments, the etching gas composition may include at least one compound selected from a boron-containing compound, a sulfur-containing compound, a fluorine-containing compound, and a chlorine-containing compound.

In the method of manufacturing the semiconductor device according to some example embodiments, the etching gas composition may include at least one selected from $BF_3$, $HBF_2$, $H_2BF$, $BCl_3$, $HBCl_2$, $H_2BCl$, $BFCl_2$, $BF_2Cl$, HBFCl, $BBr_3$, $HBBr_2$, $H_2BBr$, $BFBr_2$, $BF_2Br$, HBFBr, $BClBr_2$, $BCl_2Br$, HBClBr, and BFClBr.

In the method of manufacturing the semiconductor device according to some example embodiments, the etching of the leakage current reducing layer may be performed under a heating condition. For example, the heating condition may include a temperature in a range of about 250° C. to about 350° C. By satisfying the heating conditions, radicals may be uniformly generated from the etching gas composition.

In the method of manufacturing the semiconductor device according to some example embodiments, the etching gas composition may be supplied at a rate in a range of about 800 sccm to about 1,200 sccm. By satisfying this numerical range, the leakage current reducing layer may be uniformly etched.

The method of manufacturing the semiconductor device according to some example embodiments may further include purging the etched leakage current reducing layer with a purge gas after the etching of the leakage current reducing layer. Also, the purge gas may include chlorine gas ($Cl_2$), boron gas ($Br_2$), iodine gas ($I_2$), nitrogen gas ($N_2$), and inert gas of Group 18 elements.

In the method of manufacturing the semiconductor device according to some example embodiments, the purge gas may include the same atoms as radicals generated from the etching gas composition. Accordingly, de-doping of radical atoms bonded to the leakage current reducing layer by the purge gas may be suppressed.

In the method of manufacturing the semiconductor device according to some example embodiments, both the etching gas composition and the purge gas may include chlorine atoms.

In the method of manufacturing the semiconductor device according to some example embodiments, the purge gas may be supplied at a rate in a range of about 800 sccm to about 1,200 sccm. By satisfying this numerical range, discharge and suppression of dedoping of the etching gas composition may be performed in balance.

In the method of manufacturing the semiconductor device according to some example embodiments, the etching of the leakage current reducing layer may be performed under a pressurized condition. For example, the pressurized condition may include a pressure in a range of about 2 torr to about 4 torr. Also, by satisfying this numerical range, the etching and doping of the leakage current reducing layer may be uniformly performed.

In the method of manufacturing the semiconductor device according to some example embodiments, the pressurized condition may include an adaptive pressure. For example, the pressure may be adaptively varied with respect to a pressure change in the etching chamber. Also, a supply rate of the etching gas composition may be adjusted to vary the pressure.

The leakage current reducing layer and/or the dielectric layer included in the semiconductor device according to some example embodiments may be etched by using the etching gas. The etching gas may be the aforementioned etching gas composition including the gas. The etching gas may be activated by heating, and radicals may be generated from the etching gas. The generated radicals may react with the leakage current reducing layer and/or the dielectric layer, and in particular, may be doped into the leakage current reducing layer. For example, when the etching gas includes a chlorine-containing compound, chlorine atoms may be doped into the leakage current reducing layer by etching.

The semiconductor device according to some example embodiments, in which the leakage current reducing layer is etched by using an etching gas, may have paraelectric characteristics, and thus the semiconductor device may have an improved capacitance based at least in part upon the semiconductor device including the leakage current reducing layer which may be etched, such that performance of a semiconductor device 100 (e.g., a capacitor) may be improved due to reduced leakage current and/or increased capacitance based on the semiconductor device 100 including the leakage current reducing layer (which may be etched as described herein) according to some example embodiments.

When the leakage current reducing layer including an inorganic compound represented by $Al_{x1}L_{x2}O_{y1}X_{y2}$ is etched by using an etching gas containing $BCl_3$, the crystallinity of the inorganic compound represented by $Al_{x1}L_{x2}O_{y1}X_{y2}$ may be improved. Also, the leakage current reducing layer including the inorganic compound may have paraelectric characteristics, for example based on the improved crystallinity of the inorganic compound represented by $Al_{x1}L_{x2}O_{y1}X_{y2}$, such that performance of a semiconductor device 100 (e.g., a capacitor) may be improved due to reduced leakage current and/or increased capacitance based on the semiconductor device 100 including the leakage current reducing layer (which may be etched and/or may have improved crystallinity as described herein) according to some example embodiments.

In detail, the dielectric constant (k) of the leakage current reducing layer including the inorganic compound may be improved by greater than or equal to about 5% (e.g., about 5% to about 100%) at 0 V by etching. Also, the current density ($A/cm^2$) of the leakage current reducing layer including the inorganic compound may be improved by greater than or equal to about 9% (e.g., about 9% to about 100%) at 1 V by etching.

Also, the capacitance of the capacitor having MIM structure including the leakage current reducing layer may be improved by greater than or equal to about 10% (e.g., about 10% to about 100%).

Also, the semiconductor device according to some example embodiments, in which the leakage current reducing layer is etched by using an etching gas, may have a reduced leakage current value. In detail, when the leakage current reducing layer including the inorganic compound represented by $Al_{x1}L_{x2}O_{y1}X_{y2}$ is etched by using an etching gas containing $BCl_3$, the capacitor having MIM structure including the leakage current reducing layer may have reduced leakage current density ($A/cm^2$) compared to the existing capacitor, and thus may have improved performance due to reduced leakage current density in relation to the existing capacitor based on including the leakage current reducing layer. In detail, the semiconductor device according to some example embodiments may have a leakage current value reduced by more than about twice as much as the existing semiconductor device at about 0.1 V to about 0.5 V, and thus may have improved performance due to reduced leakage current value in relation to the existing semiconductor device based on including the leakage current reducing layer.

Figure 2:
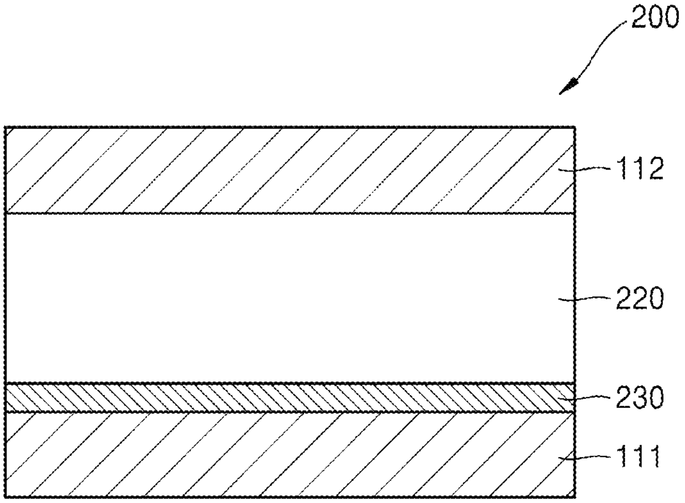
FIG. 2 is a cross-sectional view of a semiconductor device according to some example embodiments.

FIG. 2 is a cross-sectional view of a semiconductor device 200 according to some example embodiments. Hereinafter, differences from the aforementioned example embodiments will be mainly described.

Referring to FIG. 2, the semiconductor device 200 includes: the first electrode 111 and the second electrode 112 that are spaced apart from each other; a dielectric layer 220 between the first electrode 111 and the second electrode 112; and a leakage current reducing layer 230 between the first electrode 111 and the dielectric layer 220. The first electrode 111 and the second electrode 112 have been described above, and thus a description thereof will be omitted.

The dielectric layer 220 may be similar to the aforementioned first and second dielectric layers (121 and 122 in FIG. 1). The dielectric layer 220 may include a metal oxide represented by $M_xO_y$ (wherein x and y are natural numbers, rational numbers, or the like). Here, M may be a metal element selected from Ca, Sr, Ba, Sc, Y, La, Ti, Zr, Hf, Nb, Ta, Ce, Pr, Nd, Gd, Dy, Yb, and Lu. The dielectric layer 220 may have a single-film structure including a single material layer or a multi-film structure in which multiple material layers are stacked.

The leakage current reducing layer 230 may be provided between the first electrode 111 and the dielectric layer 222. The leakage current reducing layer 230 may include an inorganic compound represented by $Al_{x1}L_{x2}O_{y1}X_{y2}$. Here, L may be an element selected from Ca, Sr, Ba, Sc, Y, La, Ti, Zr, B, Ga, In, Hf, Nb, Ta, Ce, Pr, Nd, Gd, Dy, Yb, and Lu, and X may be an element selected from S, Se, Te, F, Cl, Br, and I. Such an inorganic compound may have paraelectric characteristics.

A thickness of the leakage current reducing layer 230 may be greater than or equal to about 0.1 Å and less than or equal to about 4.5 Å. A total thickness of the dielectric layer 220 and the leakage current reducing layer 230 may be less than or equal to about 50 Å. In some example embodiments, the total thickness of the dielectric layer 220 and the leakage current reducing layer 230 may be greater than or equal to about 40 Å and less than or equal to about 50 Å. However, example embodiments are not limited thereto. As described in with regard to the example embodiments shown in at least FIG. 2, the semiconductor device 200 according to some example embodiments may have an improved capacitance and a lowered leakage current value, such that performance of a semiconductor device 200 (e.g., a capacitor) may be improved due to reduced leakage current and/or increased capacitance based on the semiconductor device 200 including the leakage current reducing layer 230 according to some example embodiments.

Figure 3:
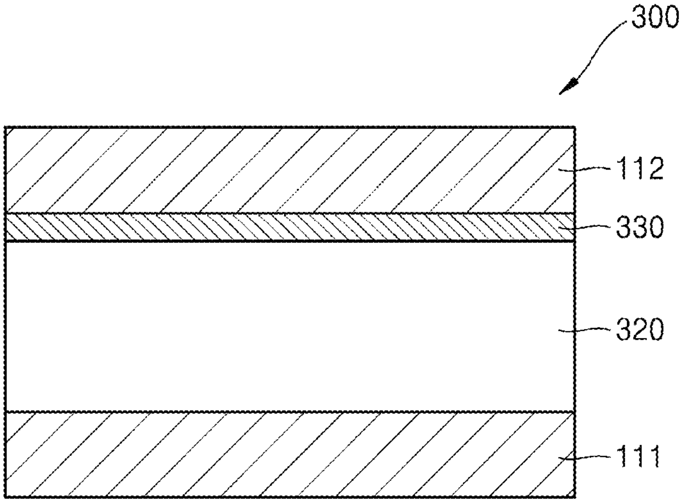
FIG. 3 is a cross-sectional view of a semiconductor device according to some example embodiments.

FIG. 3 is a cross-sectional view of a semiconductor device 300 according to some example embodiments.

Referring to FIG. 3, the semiconductor device 200 includes: the first electrode 111 and the second electrode 112 that are spaced apart from each other; a dielectric layer 320 between the first electrode 111 and the second electrode 112; and a leakage current reducing layer 330 between the second electrode 112 and the dielectric layer 320. Here, the first electrode 111 and the second electrode 112 have been described above, and thus a description thereof will be omitted.

The dielectric layer 320 may be similar to the aforementioned dielectric layer 220. The dielectric layer 320 may include a metal oxide represented by $M_xO_y$ (wherein x and y are natural numbers, rational numbers, or the like). Here, M may be a metal element selected from Ca, Sr, Ba, Sc, Y, La, Ti, Zr, Hf, Nb, Ta, Ce, Pr, Nd, Gd, Dy, Yb, and Lu. The dielectric layer 320 may have a single-film structure including a single material layer or a multi-film structure in which multiple material layers are stacked.

The leakage current reducing layer 330 may be provided between the first electrode 111 and the dielectric layer 222. The leakage current reducing layer 330 may include an inorganic compound represented by $Al_{x1}L_{x2}O_{y1}X_{y2}$. Here, L may be an element selected from Ca, Sr, Ba, Sc, Y, La, Ti, Zr, B, Ga, In, Hf, Nb, Ta, Ce, Pr, Nd, Gd, Dy, Yb, and Lu, and X may be an element selected from S, Se, Te, F, Cl, Br, and I. Such an inorganic compound may have paraelectric characteristics.

A thickness of the leakage current reducing layer 330 may be greater than or equal to about 0.1 Å and less than or equal to about 4.5 Å. A total thickness of the dielectric layer 320 and the leakage current reducing layer 330 may be less than or equal to about 50 Å. In some example embodiments, the total thickness of the dielectric layer 320 and the leakage current reducing layer 330 may be greater than or equal to about 40 Å and less than or equal to about 50 Å. However, example embodiments are not limited thereto. As described in with regard to the example embodiments shown in at least FIG. 3, the semiconductor device 300 according to some example embodiments may have an improved capacitance and a lowered leakage current value, such that performance of a semiconductor device 300 (e.g., a capacitor) may be improved due to reduced leakage current and/or increased capacitance based on the semiconductor device 300 including the leakage current reducing layer 330 according to some example embodiments.

Some example embodiments of the inventive concepts provide a semiconductor apparatus. The semiconductor apparatus may have a form in which a field effect transistor and a capacitor are electrically connected to each other, wherein the capacitor may be the aforementioned semiconductor device 100, 200, or 300. The semiconductor apparatus may have memory characteristics, and for example, may be a dynamic random access memory (DRAM). However, such example embodiments are merely examples.

Figure 4:
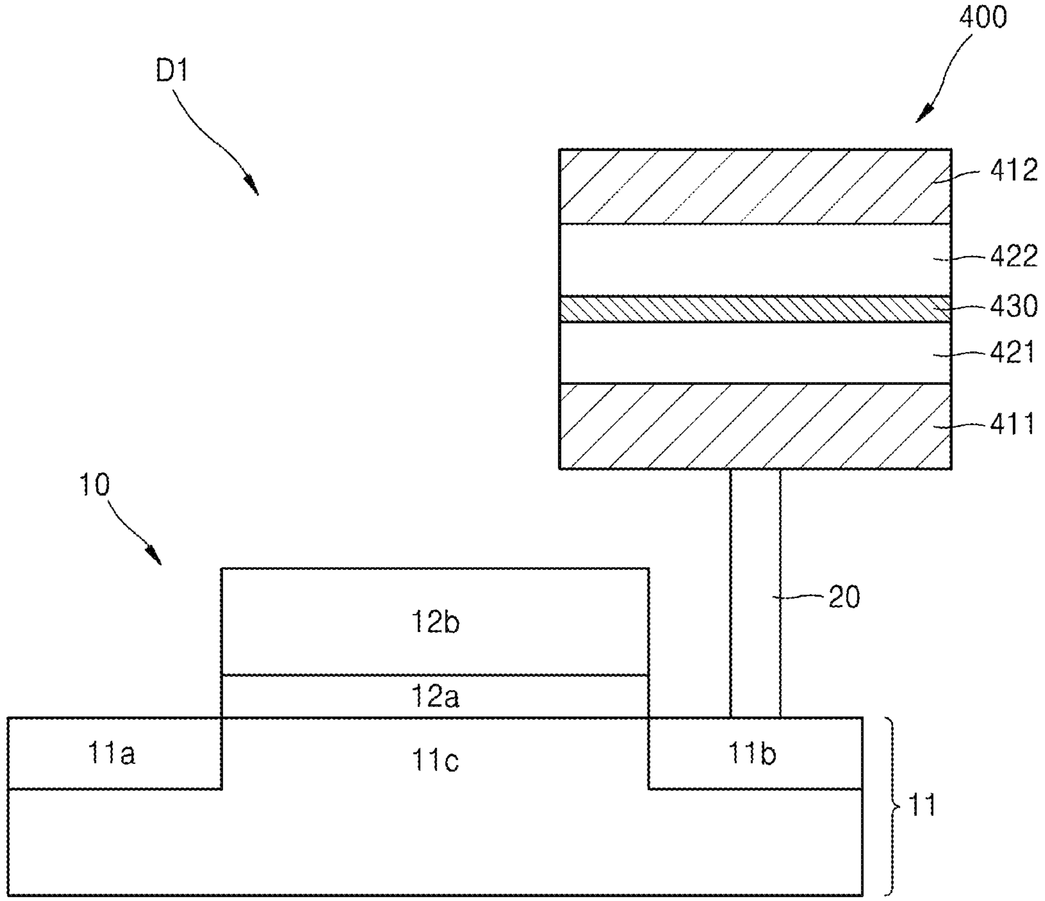
FIG. 4 is a view of a semiconductor apparatus according to some example embodiments.

FIG. 4 is a view of a semiconductor apparatus D1 according to some example embodiments.

Referring to FIG. 4, the semiconductor apparatus D1 may include a field effect transistor 10 and a capacitor 400 that are electrically connected to each other through a contact 20. The field effect transistor 10 may include: a substrate 11 including a channel 11*c*; and a gate electrode 12*b* facing the channel 11*c*. A gate insulating layer 12*a* may be provided between the substrate 11 and the gate electrode 12*b*.

The substrate 11 may include a semiconductor material. The substrate 11 may include, for example, a semiconductor material, such as silicon (Si), germanium (Ge), silicon germanium (SiGe), silicon carbide (SiC), gallium arsenic (GaAs), indium arsenic (InAs), indium phosphide (InP), or the like, and may be modified and used in various forms, such as silicon on insulator(SOI) or the like.

The substrate 11 may include: a source 11*a*, a drain 11*b*, and the channel 11*c* that electrically connects the source 11*a* and the drain 11*b*. The source 11*a* may be electrically connected to or in contact with one side of the channel 11*c*, and the drain 11*b* may be electrically connected to or in contact with the other side of the channel 11*c*. That is, the channel 11*c* may be defined as a substrate region between the source 11*a* and the drain 11*b* in the substrate 11.

The source 11*a*, the drain 11*b*, and the channel 11*c* may each independently be formed by injecting impurities into different regions of the substrate 11, and, in this case, the source 11*a*, the channel 11*c*, and the drain 11*b* may include a substrate material as a base material.

The source 11*a* and the drain 11*b* may be formed of a conductive material. The source 11*a* and the drain 11*b* may each include, for example, a metal, a metal compound, or a conductive polymer.

The channel 11*c* may be implemented as a material layer (thin film) different from the substrate 11 (not illustrated). In this case, the channel 11*c* may include, for example, an oxide semiconductor, a nitride semiconductor, an oxynitride semiconductor, a two-dimensional (2D) material, a quantum dot and/or an organic semiconductor as well as a semiconductor material, such as Si, Ge, SiGe, an element in Group III-V. For example, the oxide semiconductor may include InGaZnO or the like, the 2D material may include transition metal dichalcogenide (TMD) or graphene, and the quantum dot may include a colloidal quantum dot or a nanocrystal structure.

The gate electrode 12*b* may be disposed on the substrate 11 to be spaced apart from the substrate 11 and to face the channel 11*c*. The gate electrode 12*b* may have conductivity of, for example, less than or equal to 1 Mohm/square. The gate electrode 12*b* may include a metal, a metal nitride, a metal carbide, and/or a polysilicon. For example, the metal may include aluminum (Al), tungsten (W), molybdenum (Mo), titanium (Ti), and/or tantalum (Ta), and a metal nitride film may include a titanium nitride film (TiN film) and/or a tantalum nitride film (TaN film). The metal carbide may be a metal carbide doped with (or containing) aluminum and/or silicon, and an example thereof includes TiAlC, TaAlC, TiSiC, or TaSiC.

The gate electrode 12*b* may have a structure in which multiple materials are stacked, and for example, may have a stacked structure of metal nitride layer/metal layer, such as TiN/AI, or a stacked structure of metal nitride layer/metal carbide layer/metal layer, such as TiN/TiAlC/W. The gate electrode 12*b* may include a titanium nitride film (TiN) or molybdenum (Mo), and various modifications of the examples above may be used.

A gate insulating layer 12*a* may be further provided between the substrate 11 and the gate electrode 12*b*. The gate insulating layer 12*a* may include a paraelectric material or a high-k dielectric material. The gate insulating layer 12*a* may include a material having a dielectric constant of about 20 to about 70. For example, the gate insulating layer 12*a* may include a silicon oxide, a silicon nitride, an aluminum oxide, a hafnium oxide, a zirconium oxide, or the like, or may include a 2D insulator such as hexagonal boron nitride (h-BN).

For example, the gate insulating layer 12*a* may include a silicon oxide ($SiO_2$), a silicon nitride ($SiN_x$), a hafnium oxide ($HfO_2$), a hafnium silicon oxide ($HfSiO_4$), a lanthanum oxide ($La_2O_3$), a lanthanum aluminum oxide ($LaAlO_3$), a zirconium oxide ($ZrO_2$), a hafnium zirconium oxide ($HfZrO_2$), a zirconium silicon oxide ($ZrSiO_4$), a tantalum oxide ($Ta_2O_5$), a titanium oxide ($TiO_2$), a strontium titanium oxide ($SrTiO_3$), a yttrium oxide ($Y_2O_3$), an aluminum oxide ($Al_2O_3$), a red scandium tantalum oxide ($PbSc_{0.5}Ta_{0.5}O_3$), or a red zinc niobate ($PbZnNbO_3$). Also, the gate insulating layer 12*a* may include: a metal nitride oxide such as aluminum oxynitride (AlON), zirconium oxynitride (ZrON), hafnium oxynitride (HfON), lanthanum oxynitride (LaON), or yttrium oxynitride (YON), a silicate such as ZrSiON, HfSiON, YSiON, or LaSiON; or an aluminate such as ZrAlON or HfAlON. However, such example embodiments are merely examples. The gate insulating layer 12*a* and the gate electrode 12*b* may form a gate stack.

The capacitor 400 may be one of the semiconductor devices 100, 200, and 300 according to any of the aforementioned example embodiments. FIG. 4 illustrates an example of the capacitor 400 having a structure of the semiconductor device 100 of FIG. 1. In this case, a first dielectric layer 421 and a second dielectric layer 422 may be provided between a first electrode 411 and a second electrode 412, and a leakage current reducing layer 430 including an inorganic compound represented by $Al_{x1}L_{x2}O_{y1}X_{y2}$ may be provided between the first dielectric layer 421 and the second dielectric layer 422. However, such example embodiments are merely examples, and the capacitor 400 may have a structure of the semiconductor device 200 of FIG. 2 or a structure the semiconductor device 300 of FIG. 3. The capacitor 400 has been described above, and thus a description thereof will be omitted.

The field effect transistor 10 and the capacitor 400 may be electrically connected to each other through the contact 20. For example, one of the first electrode 411 and the second electrode 412 in the capacitor 400 may be electrically connected to one of the source 11*a* and the drain 11*b* in the field effect transistor 10 through the contact 20. The contact 20 may include a suitable conductive material, such as tungsten, copper, aluminum, polysilicon, or the like. The arrangement of the capacitor 400 and the field effect transistor 10 may be variously modified. For example, the capacitor 400 may be arranged on the substrate 11, or may be inserted into the substrate 11.

Figure 5:
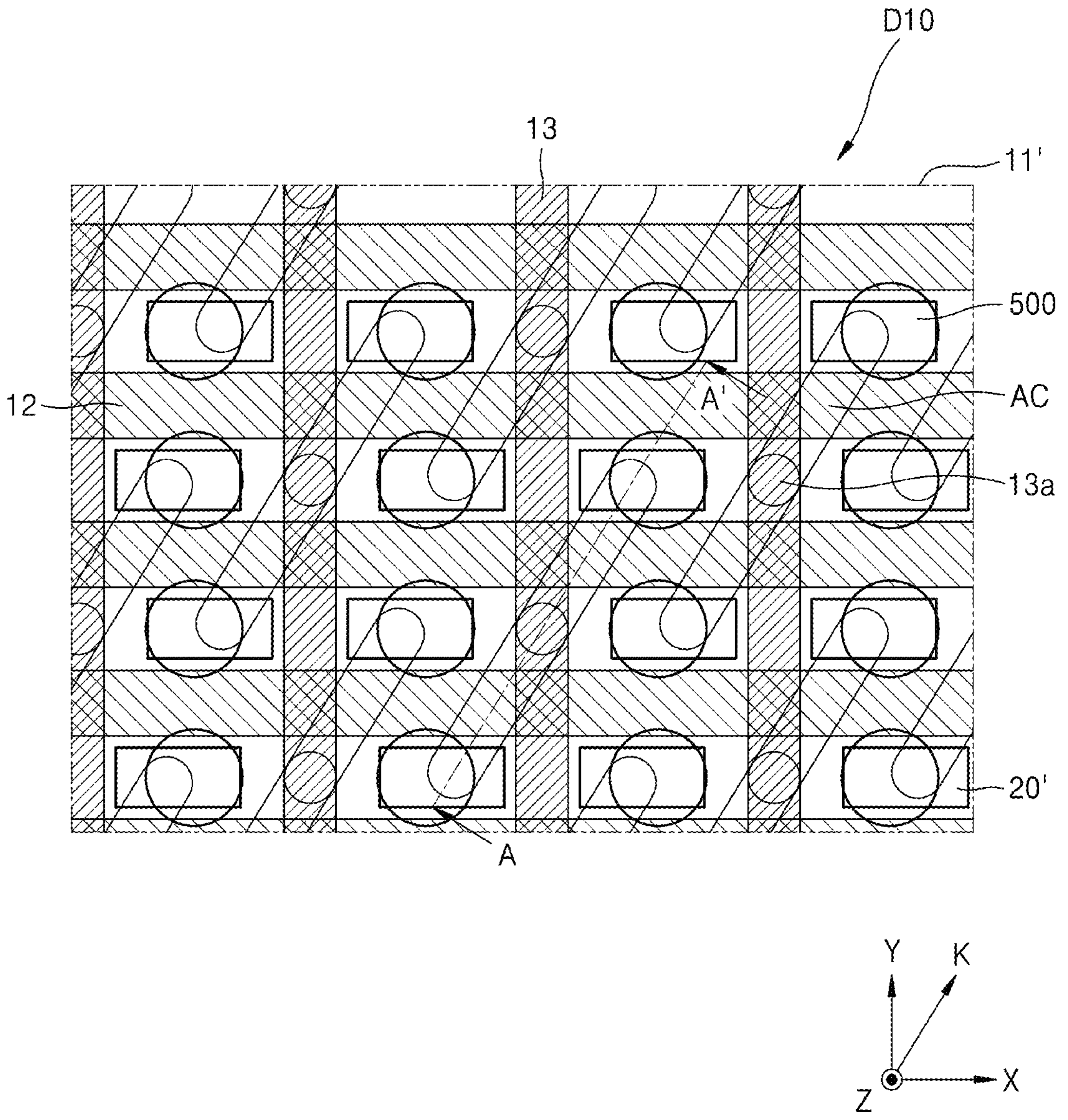
FIG. 5 is a view of a semiconductor apparatus according to some example embodiments.

FIG. 5 is a view of a semiconductor apparatus D10 according to some example embodiments. The semiconductor apparatus D10 of FIG. 5 has a structure in which multiple capacitors 500 and multiple field effect transistors are repeatedly arranged.

Referring to FIG. 5, the semiconductor apparatus D10 may include: a field effect transistor including a substrate 11' including a source, a drain, and a channel and a gate stack 12; a contact structure 20' arranged on the substrate 11' not to overlap the gate stack 12; and a capacitor 500 arranged on the contact structure 20', and may further include a bitline structure 13 electrically connecting multiple field effect transistors.

FIG. 5 shows the semiconductor apparatus D10 in which both of the contact structure 20' and the capacitor 500 are repeatedly arranged along the X direction and the Y direction, but example embodiments are not limited thereto. For example, the contact structure 20' may be arranged along the X direction and the Y direction, and the capacitor 500 may be arranged in a hexagonal shape, such as a honeycomb structure.

Figure 6:
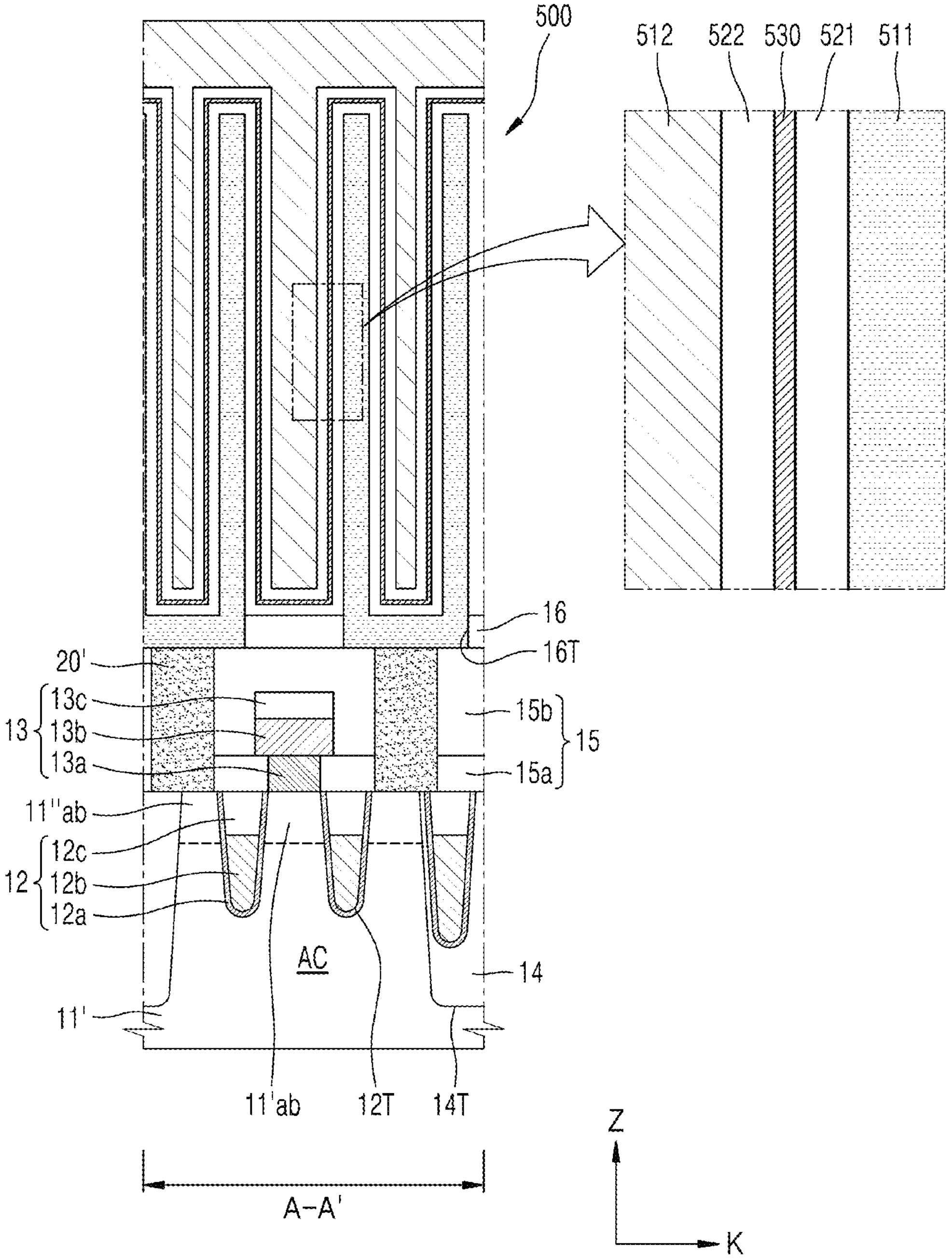
FIG. 6 is a cross-sectional view taken along line A-A' of FIG. 5 according to some example embodiments.
Figure 7:
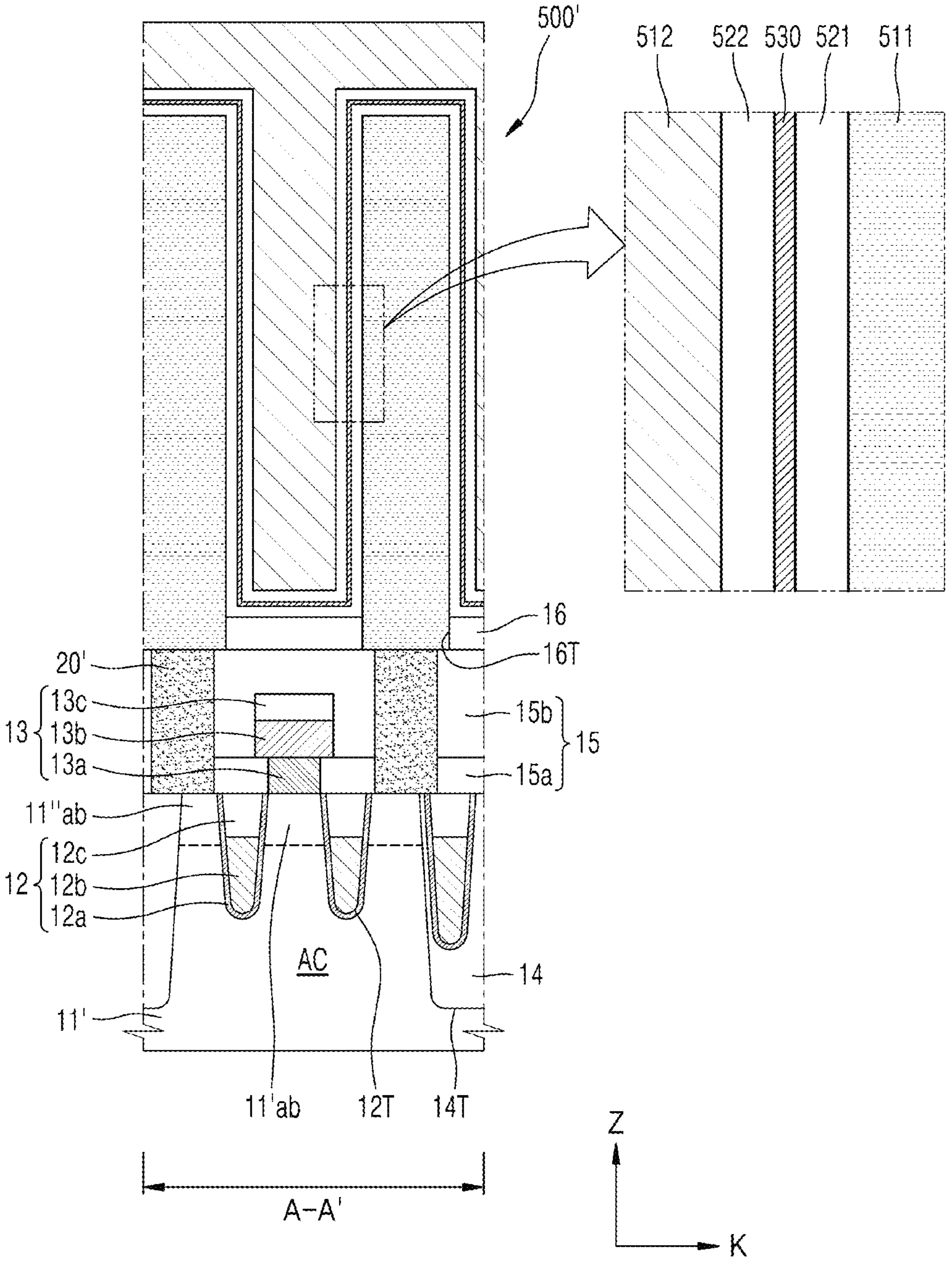
FIG. 7 is a cross-sectional view taken along line A-A' of FIG. 5 according to some example embodiments.

FIG. 6 is a cross-sectional view, of the semiconductor apparatus D10 of FIG. 5, taken along line A-A', according to some example embodiments. FIG. 7 is a cross-sectional view of the semiconductor apparatus D10 of FIG. 5, taken along line A-A', according to some example embodiments.

Referring to FIG. 6, the substrate 11' may have a shallow trench isolation (STI) structure including a device separation film 14. The device separation film 14 may be a single layer formed of one type of an insulating film, or a multi-layer formed of a combination of two or more types of an insulating film. The device separation film 14 may include a device separation trench 14T in the substrate 11', and the device separation trench 14T may be filled with an insulating material. The insulating material may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), and/or tonen silazene (TOSZ), but example embodiments are not limited thereto.

The substrate 11' may further include: an active region AC defined by the device separation film 14; and a gate line trench 12T arranged to be parallel to an upper surface of the substrate 11' and extend along the X direction. The active region AC may have a relatively long island shape having short and long axes. As illustrated in FIG. 5, the long axis of the active region AC may be arranged along the K direction parallel to the upper surface of the substrate 11'. The gate line trench 12T may be disposed at a particular (or, alternatively, predetermined) depth from the upper surface of the substrate 11' to intersect with the active region AC, or may be arranged in the active region AC. The gate line trench 12T may also be arranged inside the device separation trench 14T, and the gate line trench 12T inside the device separation trench 14T may have a lower bottom surface than the gate line trench 12T of the active region AC.

A first source/drain 11'*ab* and a second source/drain 11"*ab* may be arranged on an upper portion of the active region AC positioned on both sides of the gate line trench 12T.

The gate stack 12 may be arranged inside the gate line trench 12T. In detail, a gate insulating layer 12*a*, a gate electrode 12*b*, and a gate capping layer 12*c* may be sequentially arranged inside the gate line trench 12T. The gate insulating layer 12*a* and the gate electrode 12*b* may be understood by referring to the descriptions above, and the gate capping layer 12*c* may include a silicon oxide, a silicon oxynitride, and/or a silicon nitride. The gate capping layer 12*c* may be arranged on the gate electrode 12*b* to fill the remaining portion of the gate line trench 12T.

The bitline structure 13 may be arranged on the first source/drain 11'*ab*. The bitline structure 13 may be arranged to be parallel to the upper surface of the substrate 11' and to extend along the Y direction. The bitline structure 13 may be electrically connected to the first source/drain 11'*ab*, and may include a bitline contact 13*a*, a bitline 13*b*, and a bitline capping layer 13*c* that are sequentially stacked on the substrate 11'. For example, the bitline contact 13*a* may include polysilicon, the bitline 13*b* may include a metal material, and the bitline capping layer 13*c* may include an insulating material such as silicon nitride or silicon oxynitride. FIG. 6 illustrates an example that the bitline contact 13*a* has a bottom surface at the same level as the upper surface of the substrate 11'. However, the bitline contact 13*a* may extend to the inside of a recess (not illustrated) formed to a particular (or, alternatively, predetermined) depth from the upper surface of the substrate 11', and thus the bottom surface of the bitline contact 13*a* may be lower than the upper surface of the substrate 11'.

The bitline structure 13 may further include a bitline interlayer (not shown) between the bitline contact 13*a* and the bitline 13*b*. The bitline interlayer may include a metal silicide such as tungsten silicide, and/or a metal nitride such as tungsten nitride. In addition, a bitline spacer (not shown) may be further formed on a sidewall of the bitline structure 13. The bitline spacer may have a single-layer structure or a multi-layer structure, and may include an insulating material such as a silicon oxide, a silicon oxynitride, or a silicon nitride. Also, the bitline spacer may further include an air space (not shown).

The contact structure 20' may be arranged on the second source/drain 11"*ab*. The contact structure 20' and the bitline structure 13 may be disposed on different sources/drains on the substrate 11', respectively. The contact structure 20' may have a structure in which a lower contact pattern (not shown), a metal silicide layer (not shown), and an upper contact pattern (not shown) are sequentially stacked on the second source/drain 11"*ab*. Also, the contact structure 20' may further include a barrier layer (not shown) surrounding side surfaces and a bottom surface of the upper contact pattern. For example, the lower contact pattern may include polysilicon, the upper contact pattern may include a metal material, and the barrier layer may include a metal nitride having conductivity.

The capacitor 500 may be electrically connected to the contact structure 20' to be arranged on the substrate 11'. Here, the capacitor 500 may be one of the semiconductor devices 100, 200, and 300 according to the any of the aforementioned example embodiments. FIG. 6 illustrates an example of the capacitor 500 having a structure of the semiconductor device 100 of FIG. 1.

The capacitor 500 may include: a first electrode 511 electrically connected to the contact structure 20'; a second electrode 512 spaced apart from the first electrode 511; a first dielectric layer 521 and a second dielectric layer 522 provided between the first electrode 511 and the second electrode 512; and a leakage current reducing layer 530 provided between the first dielectric layer 521 and the second dielectric layer 522 and including an inorganic compound represented by $Al_{x1}L_{x2}O_{y1}X_{y2}$. However, such example embodiments are merely examples, and the capacitor 500 may have a structure of the semiconductor device 200 of FIG. 2 or a structure the semiconductor device 300 of FIG. 3.

An interlayer insulation layer 15 may be further arranged between the capacitor 500 and the substrate 11'. The interlayer insulating layer 15 may be arranged in a space where no other structure is arranged between the capacitor 500 and the substrate 11'. In detail, the interlayer insulation layer 15 may be arranged to cover the wiring and/or electrode structure of the bitline structure 13, the contact structure 20', the gate stack 12, or the like on the substrate 11'. For example, the interlayer insulation layer 15 may surround the walls of the contact structure 20'. The interlayer insulation layer 15 may include a first interlayer insulation layer 15*a* surrounding the bitline contact 13*a* and a second interlayer insulation layer 15*b* covering the side surfaces and/or upper surfaces of the bitline 13*b* and the bitline capping layer 13*c*.

The first electrode 511 of the capacitor 500 may be arranged on the interlayer insulation layer 15, more particularly, on the second interlayer insulation layer 15*b*. Also, when multiple capacitors 500 are disposed, the bottom surfaces of the multiple first electrodes 511 may be separated by an etch-stop layer 16. In other words, the etch-stop layer 16 may include an opening 16T, and the bottom surface of the first electrode 100 of the capacitor 500 may be arranged in the opening 16T.

The first electrode 511 may have a cylinder shape or a cup shape, in which the bottom is sealed, as illustrated in FIG. 6. Meanwhile, as another example, the first electrode 511 may have a pillar shape, such as a cylinder pillar, a quadrangular pillar, or a polygonal pillar, extending along the vertical direction (Z direction), as in a capacitor 500' illustrated in FIG. 7. The capacitor 500' may further include a support (not shown) that prevents the first electrode 511 from tilting or falling, and such a support may be arranged on a sidewall of the first electrode 511.

The aforementioned semiconductor apparatus D10 may be manufactured by using a conventional method known in the art. For example, the semiconductor apparatus D10 may be manufactured by using a method including the following steps i) to xvi):

i) forming a device separation trench 14T on a substrate 11', and forming a device separation film 14 in the device separation trench 14T (defining an active region AC of a substrate 11' by the device separation film 14 and/or the device separation trench 14T);

ii) filling the inside of the device separation trench 14T with an insulating material;

iii) forming a first source/drain 11'*ab* and a second source/drain 11"*ab* in an upper region of the active region AC by injecting impurity ions into the substrate 11';

iv) forming a gate line trench 12T in the substrate 11';

v) forming a gate insulating layer 12*a*, a gate electrode 12*b*, and a gate capping layer 12*c* in the gate line trench 12T;

vi) forming a first insulating layer 15*a* on the substrate 11', and forming an opening (not illustrated) exposing an upper surface of the first source/drain 11'*ab;* vii) forming a bitline structure 13 electrically connected to the first source/drain 11'*ab* on the opening formed in the step vi);

viii) forming a second insulating layer 15*b* covering an upper surface and side surfaces of the bitline structure 13;

ix) forming an opening (not shown) such that an upper surface of the second source/drain 11"*ab* is exposed to the first interlayer insulating layer 15*a* and the second interlayer insulating layer 15*b;* x) forming a contact structure 20' electrically connected to the second source/drain 11"*ab* on the opening formed in the step ix);

xi) forming an etch-stop layer 16 and a mold layer (not shown) on the second interlayer insulating layer 15*b* and the contact structure 20';

xii) forming an opening (not shown) in the etch-stop layer 16 and the mold layer (not illustrated) such that an upper surface of the contact structure 20' is exposed;

xiii) forming the first electrode 100 to cover the inner walls of the opening formed in the step xii) (to cover the bottom surface and side surfaces);

xiv) removing the mold layer (not shown);

xv) forming a first dielectric layer 511, a leakage current reducing layer 530, and a second dielectric layer 512 on the first electrode 511; and xvi) forming a second electrode 512 on the second dielectric layer 512.

The type and/or order of each step described above is not limited and can be appropriately adjusted, and some steps may be omitted or added. Also, in each step, a deposition process, a patterning process, an etch process, etc., as known in the art in forming components may be used. For example, when forming the electrodes, an etch-back process may be applied. In the step v), the gate electrode 12*b* may be formed by forming a conductive layer on the gate insulating layer 12*a* and removing an upper portion of the conductive layer by a particular (or, alternatively, predetermined) height through the etch-back process. Also, in step xiii), the first electrode 511 may be formed to cover all of the upper surface of the mold layer, the bottom surface and side surfaces of the opening, and then a portion of the electrode on the upper surface of the mold layer may be removed through the etch-back process, thereby producing a structure having multiple first electrodes 511. For another example, a planarization process may be applied. For example, in step v), the gate capping layer 12*c* may be formed by filling a remaining portion of the gate line trench 12T with an insulating material, and then planarizing the insulating material until an upper surface of the substrate 11' is exposed.

In some example embodiments, the aforementioned semiconductor devices 100, 200, and 300 and the semiconductor apparatuses D1 and D10 may be applied to various electronic apparatuses. For example, the aforementioned semiconductor devices 100, 200, and 300 and/or the semiconductor apparatuses D1 and D10 may be used as logical devices or memory devices in various electronic apparatuses. In detail, the semiconductor devices 100, 200, and 300 and the semiconductor apparatuses D1 and D10 may be used for arithmetic operations, program execution, and temporary data storage in electronic apparatuses such as mobile apparatuses, computers, laptop computers, sensors, network apparatuses, neuromorphic apparatuses. The semiconductor devices and the semiconductor apparatuses according to some example embodiments may be useful in electronic apparatuses which have a large data transmission volume and continuously transmit data.

Figure 8:
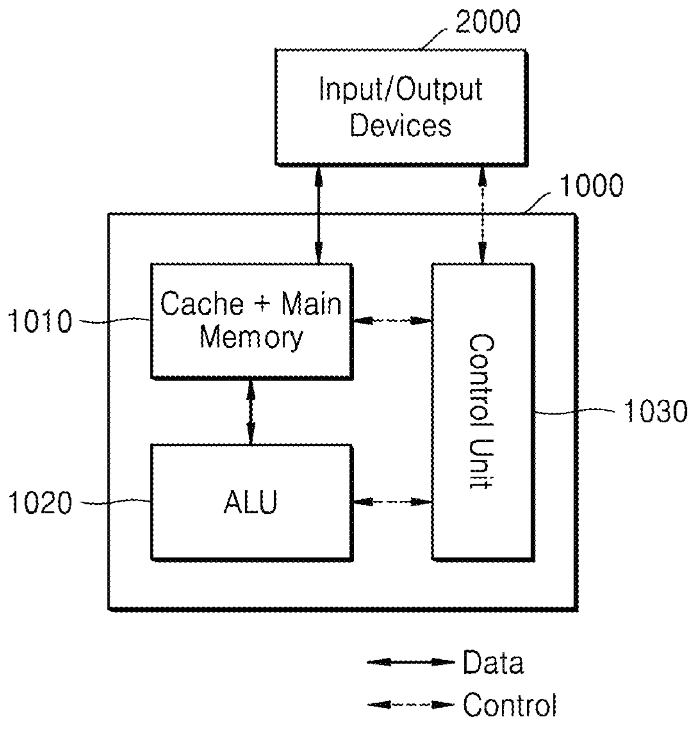
FIG. 8 is a conceptual diagram schematically illustrating a device architecture applicable to an electronic apparatus according to some example embodiments.
Figure 9:
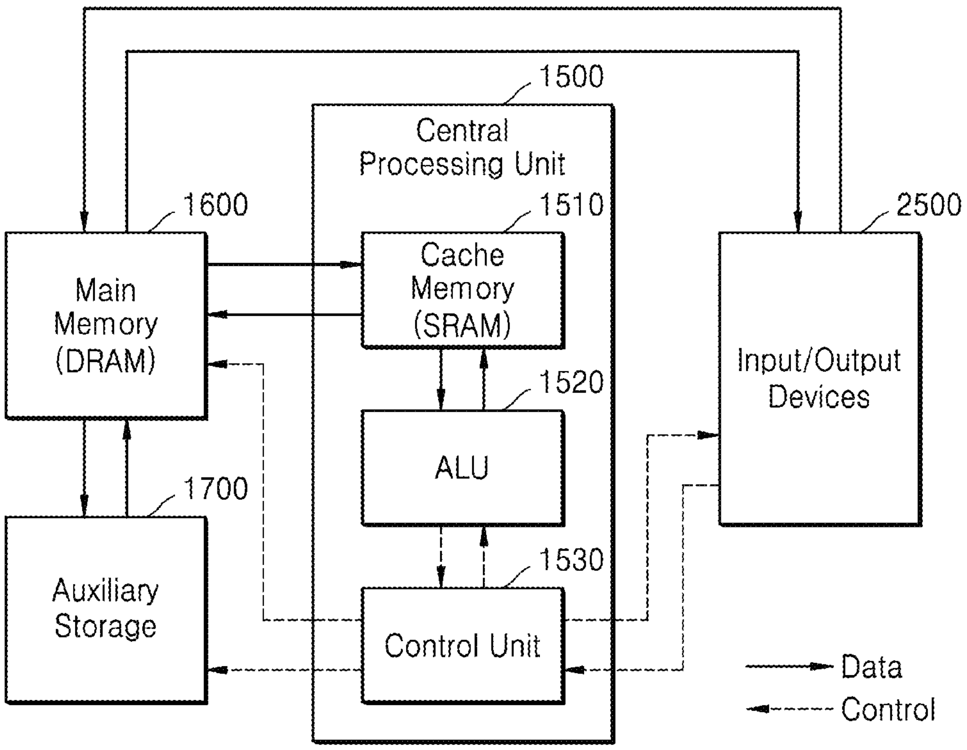
FIG. 9 is a conceptual diagram schematically illustrating a device architecture applicable to an electronic apparatus according to some example embodiments.

FIGS. 8 and 9 are conceptual diagrams schematically showing a device architecture that is applicable to an electronic apparatus according to some example embodiments.

FIGS. 8 and 9 are conceptual diagrams schematically showing a device architecture that is applicable to an electronic apparatus according to some example embodiments. The memory unit 1010, the ALU 1020, and the control unit 1030 may be electrically connected to each other. For example, the device architecture 1000 may be implemented as a single chip including the memory unit 1010, the ALU 1020, and the control unit 1030. In detail, the memory unit 1010, the ALU 1020, and the control unit 1030 may be connected to each other through on-chip metal lines for direct communication. The memory unit 1010, the ALU 1020, and the control unit 1030 may be monolithically integrated on one substrate to form a single chip. The device architecture 1100 may be connected to an input/output device 2000. In addition, the memory unit 1010 may include both a main memory and a cache memory. The device architecture 1000 may be an on-chip memory processing unit. The memory unit 1010, the ALU 1020 and/or the control unit 1030 may each independently include the aforementioned semiconductor device.

Referring to FIG. 9, a cache memory 1510, an ALU 1520, and a control unit 1530 may constitute a central processing unit (CPU) 1500, and the cache memory 1510 may include a static random access memory (SRAM). Separately from the CPU 1500, a main memory 1600 and a secondary storage 1700 may be provided. The main memory 1600 may be a DRAM, and may include the aforementioned semiconductor device. In some cases, the device architecture 1000 may be implemented in a form in which computing unit devices and memory unit devices are adjacent to each other in a single chip without distinguishing sub-units.

Although the embodiments have been described above, these are merely examples, and various modifications will be made therefrom by those skilled in the art.

When a leakage current reducing layer including an inorganic compound represented by $Al_{x1}L_{x2}O_{y1}X_{y2}$ is provided on a dielectric layer, the leakage current of a semiconductor device (i.e., a capacitor) according to some example embodiments may be reduced and a capacitance thereof may be increased.

In addition, the semiconductor device may be applied to semiconductor apparatuses such as DRAM, and electronic apparatuses such as mobile apparatuses, computers, laptop computers, sensors, network apparatuses, neuromorphic apparatuses.

As described herein, any devices, systems, modules, units, controllers, circuits, architectures, and/or portions thereof according to any of the example embodiments (including, without limitation, the semiconductor device 100, the semiconductor device 200, the semiconductor device 300, the semiconductor apparatus D1, the field effect transistor 10, the capacitor 400, the semiconductor apparatus D10, the capacitor 500, the capacitor 500', the device architecture 1000, the memory unit 1010, the arithmetic logic unit (ALU) 1020, the control unit 1030, the input/output devices 2000, the CPU 1500, the cache memory 1510, the ALU 1520, the control unit 1530, the main memory 1600, the auxiliary storage 1700, the input/output devices 2500, or the like) may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods, and/or any portions thereof, performed by some or all of any devices, systems, modules, units, controllers, circuits, architectures, and/or portions thereof according to any of the example embodiments.

Any of the memories, memory units, memory chips, storages, storage devices, or the like as described herein may be a non-transitory computer readable medium and may store a program of instructions. Any of the memories, memory units, memory chips, storages, storage devices, or the like described herein may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

It should be understood that example embodiments described herein should be considered in a descriptive sense only and not for purposes of limitation. Descriptions of features or aspects within each example embodiment should typically be considered as available for other similar features or aspects in some example embodiments. While some example embodiments have been described with reference to the figures, it will be understood by those of ordinary skill in the art that various changes in form and details may be made therein without departing from the spirit and scope as defined by the following claims.

What is claimed is:

1. A semiconductor device, comprising:

a first electrode;

a second electrode spaced apart from the first electrode;

a dielectric layer between the first electrode and the second electrode, the dielectric layer including a metal oxide represented by $M_aO_b$, wherein M is an element selected from calcium (Ca), strontium (Sr), barium (Ba), scandium (Sc), yttrium (Y), lanthanum (La), titanium (Ti), Zirconium (Zr), boron (B), gallium (Ga), indium (In), hafnium (Hf), niobium (Nb), tantalum (Ta), cerium (Ce), praseodymium (Pr), neodymium (Nd), gadolinium (Gd), dysprosium (Dy), ytterbium (Yb), and lutetium (Lu), and a and b are each independently a rational number; and a leakage current reducing layer on the dielectric layer between the first electrode and the second electrode, the leakage current reducing layer including an inorganic compound represented by $Al_{x1}L_{x2}O_{y1}X_{y2}$, wherein L is an element selected from Ca, Sr, Ba, Sc, Y, La, Ti, Zr, B, Ga, In, Hf, Nb, Ta, Ce, Pr, Nd, Gd, Dy, Yb, and Lu, X is an element selected from sulfur(S), selenium (Se), tellurium (Te), fluorine (F), chlorine (Cl), bromine (Br), and iodine (I), x1, x2, y1, and y2 are each independently a rational number, x1+x2 is a rational number greater than or equal to 1 and less than or equal to 3, and y1+y2 is a rational number greater than or equal to 1 and less than or equal to 5.

2. The semiconductor device of claim 1, wherein M is an element selected from Ca, Sr, Ba, Zr, and B.

3. The semiconductor device of claim 1, wherein a is an integer from 1 to 3, and b is an integer from 1 to 5.

4. The semiconductor device of claim 1, wherein L is an element selected from Ca, Sr, Ba, B, and Zr.

5. The semiconductor device of claim 1, wherein X is an element selected from F, Cl, Br, and I.

6. The semiconductor device of claim 1, wherein x1, x2, y1, and y2 satisfy Conditions i) to iii):

i) $x1+x2=2$;

ii) $y1+y2=3$; and iii) $0.5 \leq y2 \leq 2$.

7. The semiconductor device of claim 1, wherein the dielectric layer comprises a first dielectric layer and a second dielectric layer, and the leakage current reducing layer is between the first dielectric layer and the second dielectric layer.

8. The semiconductor device of claim 1, wherein the leakage current reducing layer is between the first electrode and the dielectric layer.

9. The semiconductor device of claim 1, wherein the leakage current reducing layer is between the second electrode and the dielectric layer.

10. The semiconductor device of claim 1, wherein a thickness of the leakage current reducing layer is greater than or equal to 0.1 Å and less than or equal to 4.5 Å.

11. The semiconductor device of claim 1, wherein a total thickness of the dielectric layer and the leakage current reducing layer is less than or equal to 50 Å.

12. The semiconductor device of claim 1, wherein the dielectric layer has a single-film structure or a multi-layer structure in which different materials are stacked.

13. The semiconductor device of claim 1, wherein the first electrode and the second electrode each include at least one selected from tungsten (W), TaN, TiN, $RuO_x$, TiN, NbN, Sc, aluminum (Al), molybdenum (Mo), molybdenum nitride (MoN), palladium (Pd), platinum (Pt), tin (Sn), La, and ruthenium (Ru).

14. The semiconductor device of claim 1, wherein one of the first electrode or the second electrode comprises a semiconductor material.

15. A semiconductor apparatus, comprising:

a field effect transistor; and a capacitor electrically connected to the field effect transistor, wherein the capacitor includes a first electrode;

a second electrode spaced apart from the first electrode;

a dielectric layer between the first electrode and the second electrode, the dielectric layer including a metal oxide represented by $M_aO_b$, wherein M is an element selected from calcium (Ca), strontium (Sr), barium (Ba), scandium (Sc), yttrium (Y), lanthanum (La), titanium (Ti), Zirconium (Zr), boron (B), gallium (Ga), indium (In), hafnium (Hf), niobium (Nb), tantalum (Ta), cerium (Ce), praseodymium (Pr), neodymium (Nd), gadolinium (Gd), dysprosium (Dy), ytterbium (Yb), and lutetium (Lu), and a and b are each independently a rational number; and a leakage current reducing layer on the dielectric layer between the first electrode and the second electrode, the leakage current reducing layer including an inorganic compound represented by $Al_{x1}L_{x2}O_{y1}X_{y2}$, wherein L is an element selected from Ca, Sr, Ba, Sc, Y, La, Ti, Zr, B, Ga, In, Hf, Nb, Ta, Ce, Pr, Nd, Gd, Dy, Yb, and Lu, and X is an element selected from sulfur(S), selenium (Se), tellurium (Te), fluorine (F), chlorine (Cl), bromine (Br), and iodine (I), x1, x2, y1, and y2 are each independently a rational number, x1+x2 is a rational number greater than or equal to 1 and less than or equal to 3, and y1+y2 is a rational number greater than or equal to 1 and less than or equal to 5.

16. The semiconductor apparatus of claim 15, wherein the field effect transistor comprises:

a semiconductor layer comprising a source and a drain;

a separate dielectric layer on the semiconductor layer; and a gate electrode on the separate dielectric layer.

17. The semiconductor apparatus of claim 15, wherein the dielectric layer comprises a first dielectric layer and a second dielectric layer, and the leakage current reducing layer is between the first dielectric layer and the second dielectric layer.

18. The semiconductor apparatus of claim 15, wherein the leakage current reducing layer is between the first electrode and the dielectric layer, or between the second electrode and the dielectric layer.

19. The semiconductor apparatus of claim 15, wherein the first electrode and the second electrode each comprise at least one selected from tungsten (W), TaN, TiN, $RuO_x$, TiN, NbN, Sc, aluminum (Al), molybdenum (Mo), molybdenum nitride (MoN), palladium (Pd), platinum (Pt), tin (Sn), La, and ruthenium (Ru).

20. An electronic apparatus comprising the semiconductor apparatus of claim 15.

* * * * *